United States Patent [19]

Hildebrandt et al.

[11] 4,161,781

[45] Jul. 17, 1979

[54] DIGITAL TAPE RULE

[75] Inventors: William J. Hildebrandt, Simsbury; Robert F. West, West Simsbury, both of Conn.

[73] Assignee: The Stanley Works, New Britain, Conn.

[21] Appl. No.: 854,670

[22] Filed: Nov. 25, 1977

[51] Int. Cl.² ............... G06M 1/272; G01B 3/08
[52] U.S. Cl. ........................ 364/562; 33/140; 235/92 DN; 235/92 V
[58] Field of Search ............... 364/560–562; 235/92 DN, 92 MP, 92 V, 92 EV; 33/121–124, 125 M, 125 R, 133, 137 R, 137 L, 140, 141 R; 242/84.8; 250/561, 209

[56] References Cited

U.S. PATENT DOCUMENTS

| 3,654,449 | 4/1972 | Boyce | 364/709 |
| 3,777,126 | 12/1973 | Hoff | 364/505 |
| 3,793,508 | 2/1974 | Maggi | 235/92 V |
| 3,811,648 | 5/1974 | Ream, Jr. et al. | 235/92 V |
| 4,031,360 | 6/1977 | Soule, Jr. | 235/92 DN |
| 4,039,805 | 8/1977 | Newell | 364/562 |

Primary Examiner—Errol A. Krass
Attorney, Agent, or Firm—Prutzman, Kalb, Chilton & Alix

[57] ABSTRACT

In a measuring device such as a coilable tape rule, the movable elongated measuring element or blade is provided with a series of optical markings to indicate passage of distance. Photoelectric sensing means in the form of a pair of sensors carried by the stationary element such as the tape rule housing detects shifts in light level or transitions provided by the markings when the blade is illuminated and moved to traverse a distance being measured. A phase relationship of the sensors and the markings is utilized by logic circuitry to provide signals indicative of both amount and direction of movement. The logic signals are counted to indicate net distance traversed by the blade which indication is converted to units of measure and visually displayed. The blade can include conventional graduations and related indicia along with the optical markings so as to be both human readable and machine readable. Duplicate pairs of sensors are provided and signals associated with both pairs are compared for error detection, and the error detection circuitry has an externally applied reset controlled according to signals associated with the sensor pairs.

43 Claims, 21 Drawing Figures

| INTERNAL STATE NAMES | INTERNAL STATES | | INPUTS | | | | | | |
|---|---|---|---|---|---|---|---|---|---|
| | FF 1 | FF 2 | b 0 | a 0 | b 0 | a 1 | b 1 | a 1 | b 1 | a 0 |
| W | 0 | 0 | ①PC | | 2 | | 6 | | ⑤NC |
| X | 0 | 1 | ⑧NC | | ②PC | | 3 | | 5 |
| Y | 1 | 1 | 8 | | ⑦NC | | ③PC | | 4 |
| Z | 1 | 0 | 1 | | 7 | | ⑥NC | | ④PC |

FIG. 12
| ROW NUMBER | PC 1 | NC 1 | PC 2 | NC 2 | -1 | 0 | +1 | |
|---|---|---|---|---|---|---|---|---|
| 1 | 1 | 0 | 0 | 0 | 0 | +1 | E | Q |
| 2 | 0 | 1 | 0 | 0 | E | -1 | 0 | R |
| 3 | 0 | 0 | 1 | 0 | E | -1 | 0 | S |
| 4 | 0 | 0 | 0 | 1 | 0 | +1 | E | T |
| 5 | 1 | 0 | 1 | 0 | -1 | 0 | +1 | U |
| 6 | 1 | 0 | 0 | 1 | +1 | E | E | V |
| 7 | 0 | 1 | 1 | 0 | E | E | -1 | W |
| 8 | 0 | 1 | 0 | 1 | -1 | 0 | +1 | X |
| 9 | 0 | 0 | 0 | 0 | -1 | 0 | +1 | Y |
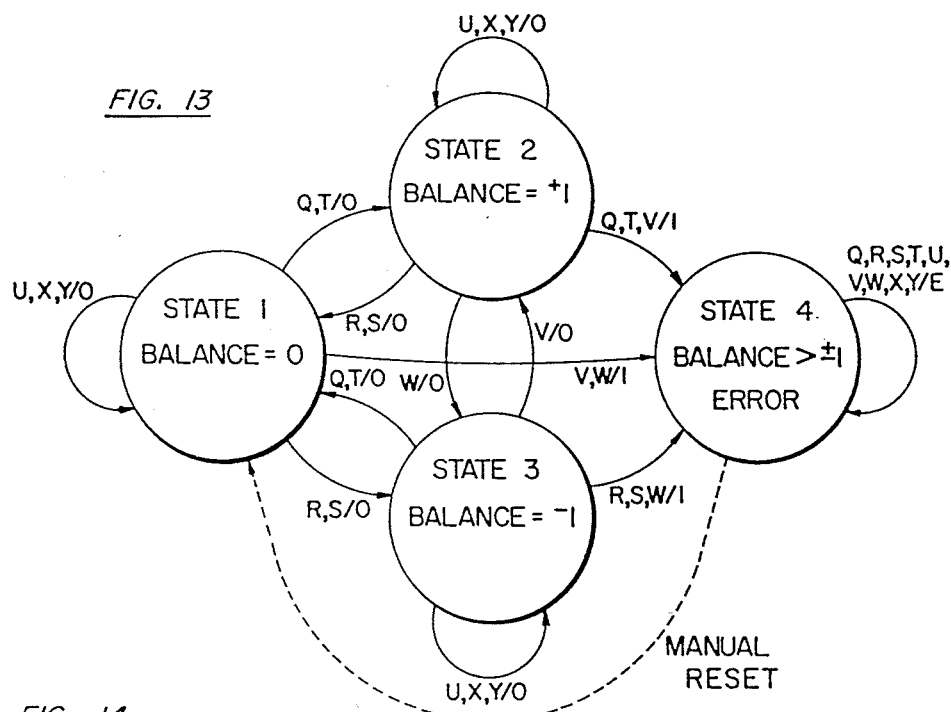
FIG. 13
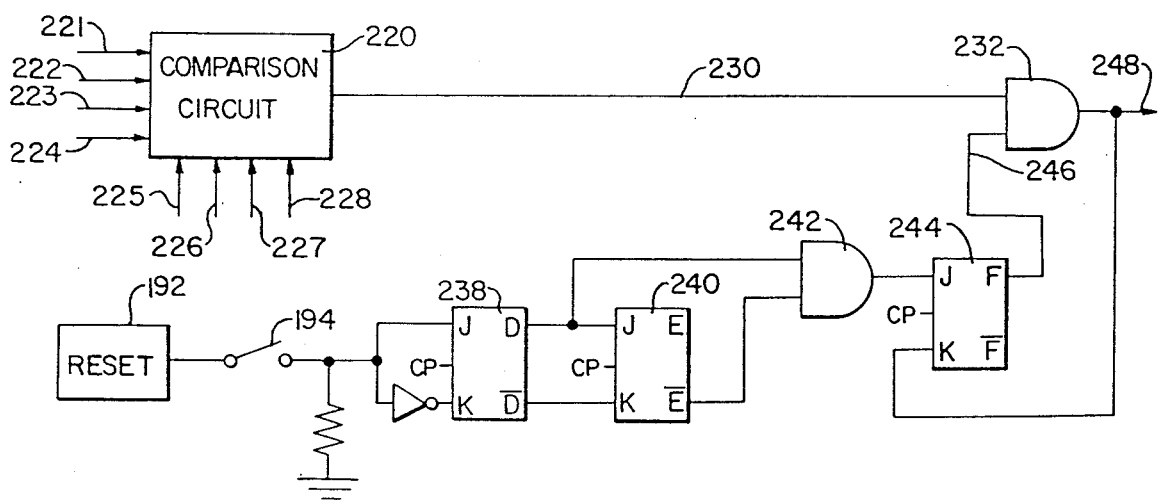
FIG. 14

DIGITAL TAPE RULE

BACKGROUND OF THE INVENTION

This invention relates to the art of distance measuring apparatus, and more particularly to a new and improved measuring device in the form of a tape rule providing digital display of measured distance readings.

The present invention involves the application of miniaturized digital electronics technology to a conventional coilable tape rule to provide a visual digital display of length readings. Advantages of such a digital tape rule would include the storage of previous readings while a present measurement is being made, sequential display of individual stored readings upon demand, the indication of equality between a displayed reading and a measurement made, the ability to add accumulation and calculation means to the device for processing stored readings, the selection of various modes of measurement such as inside or outside relative to the device housing, and the conversion of length readings to various measuring systems, such as English or Metric, prior to display.

In the design of such a digital tape rule, a number of considerations are involved. For example, the electronics should track the position of the measuring element or blade both during extension and return. In other words, the system should have bi-directional capability to indicate net distance traversed. The design should be compatible with a conventionally-configured and graduated tape measuring blade so that the tape rule is both human readable and machine readable. The system should read and display the measured distance traversed by the blade with a high degree of accuracy, with the capability of indicating any errors, and with the ability to accomodate a wide range in blade speed, including zero velocity.

SUMMARY OF THE INVENTION

It is, therefore, an object of this invention to provide a new and improved measuring apparatus in the form of a tape rule device with electronic detection of measured distance and digital display of the same.

It is a further object of this invention to provide such measuring apparatus which is both machine readable and human readable.

It is a further object of this invention to provide such measuring apparatus which indicates net distance traversed during successive movement of the measuring element in first one direction and then the other.

It is a further object of this invention to provide such measuring apparatus which is compatible with movement of the measuring element over a wide speed range, including zero velocity.

It is a further object of this invention to provide such measuring apparatus which is highly accurate and has an error detection capability.

It is a further object of this invention to provide such measuring apparatus which stores measured distances for processing and display.

It is a further object of this invention to provide such measuring apparatus which is efficient and effective in operation and relatively simple in construction.

It is a further object of this invention to provide such measuring apparatus which is sufficiently small in size and light in weight so as to be hand-held and portable.

The present invention provides measuring apparatus, in the form of a tape rule measuring device including an elongated measuring element in the form of a coilable blade adapted to be extended and retracted relative to a housing, wherein optical markings are provided in a series at constant intervals along the blade for indicating the passage of distance when the markings are irradiated by light and the blade is moved relative to the housing. Photoelectric sensing means carried by the housing and operatively associated with the markings on the blade provides output signals at constant increments of distance during movement of the blade. Readout means operatively connected to the sensing means converts the signals to an indication of distance travelled by the blade.

The blade can include conventional graduations and related indicia along with the optical markings so that the device is both human readable and machine readable. The photoelectric sensing means preferably comprises a pair of photoelectric sensors, and a phase relationship of the sensors and optical markings is utilized by logic circuitry to provide signals indicative of both amount and direction of movement of the blade. The logic signals are applied to a counter which gives an output indicating net distance traversed by the blade, and the counter output is converted to units of measure for visual observation on a digital display. In order to detect errors arising from scratches, marks or other imperfections associated with the optical markings, duplicate pairs of sensors and logic circuitry are provided, and signals associated with the two pairs or channels are monitored by circuitry which indicates an error when the difference in signals exceeds a predetermined value. The monitoring circuitry has an externally applied reset which is controlled according to a predetermined relationship between signals associated with both sensors in the two channels.

The foregoing and additional advantages and characterizing features of the present invention will become clearly apparent upon a reading of the ensuing detailed description together with the included drawing wherein:

BRIEF DESCRIPTION OF THE DRAWING FIGURES

FIG. 2A is a diagrammatic view illustrating the optical markings on the blade and the light source and two of the photoelectric sensors in the tape rule of FIG. 1;

FIG. 12 is a logic state table illustrating the operation of the error monitor in the system of FIG. 9;

FIG. 13 is a logic state diagram further illustrating the operation of the error monitor in the system of FIG. 9; and FIG. 14 is a schematic diagram of a controlled reset circuit for the error monitor in the system of FIG. 9.

DETAILED DESCRIPTION OF THE ILLUSTRATED EMBODIMENTS

In a conventional tape rule device and like measuring apparatus, an elongated member such as a coilable tape measuring element or blade is extended and retracted relative to a body member, such as a tape rule housing, to traverse a distance to be measured. In accordance with the present invention, the elongated measuring element or blade is provided with a series of optical markings to indicate the passage of distance in the form of a series of adjacent areas of first and second optical characteristics wherein the transitions are at constant intervals along the blade. The markings on the blade are illuminated by suitable means such as a light source carried by the housing. Photoelectric sensing means in the form of a pair of sensors carried by the housing and operatively associated with the markings on the blade is responsive to the optical characteristics and detects the transitions therebetween to provide signals indicative of fixed distance of movement. The sensors and markings are arranged in a phase relationship such that only one transition is detected by any one sensor at a given time. Signals from the sensors are processed by logic circuitry to provide coded signals indicative of both extent and direction of movement of the blade which, in turn, are applied to a counting means to provide an indication of the net distance traversed by the blade. A digital display connected through a unit convertor to the counter provides a visual reading of the measured distance in units of a selected measuring system, such as English or Metric. The blade can include conventional graduations and related indicia so as to be both human readable and machine readable, and the light source and photoelectric sensors are optically coupled to the markings on the blade by fiber optic bundles. In order to detect errors arising from damage to the optical markings and blade, there is provided a duplicate pair of photoelectric sensors and logic circuitry to provide another channel which is operatively associated with the optical markings on the blade. Signals from both channels are compared by error monitor circuitry, and when the difference therebetween exceeds a predetermined amount an error is signaled. An externally applied reset of the error detection circuitry is controlled to be applied only when the signals in each of the channels are in proper agreement.

Figure 1:
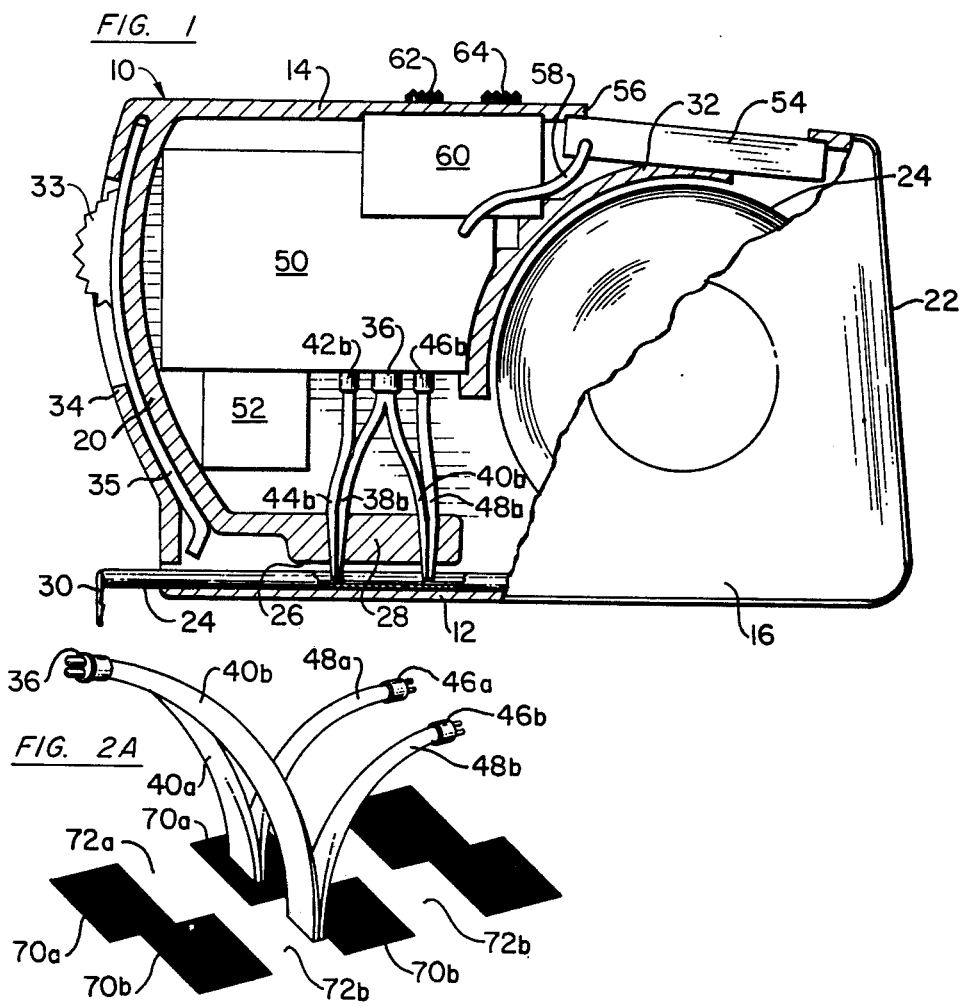
FIG. 1 is a side elevational view, with parts removed and some parts shown in section, of measuring apparatus in the form of a digital tape rule according to the present invention.

Referring now to FIG. 1, there is shown measuring apparatus in the form of a digital tape rule measuring device according to the present invention comprising a body member or housing 10 having a base or bottom portion 12, a top wall portion 14, and spaced-apart generally parallel side walls 16 and 18 which are joined by oppositely-located end walls 20 and 22. A measuring tape element or blade 24 is housed in coiled form within the casing 10 under the biasing force of a return spring (not shown) in a well known manner. Blade 24 is of metal such as spring steel, has an arcuate cross section between spaced parallel edges, and is quite thin. One end of the blade 24 is fixed within the casing and the opposite or free end extends out from the casing through a mouth or passage 26 defined between base 12 and wall or flange 28 portion extending inwardly from end wall 20. The free end of blade 24 is provided with a hook element 30 to facilitate the marking of measurements in a known manner. Thus, blade 24 is extended from the casing against the biasing force of the return spring, and the region of the hollow casing interior containing the coiled blade is defined by the various casing wall portions adjacent the end wall 22 and further by an arcuate interior guide wall 32. A blade lock carried by housing 10 includes a manually-operated button portion 33 extending out through an opening in an extension 34 of housing end wall 20 and a blade engaging member 35 movable between wall 20 and extension 34 into and out of engagement with blade 24 by operation of button 33 in a known manner.

In accordance with this invention the tape rule measuring device of FIG. 1 includes a plurality of optical markings, which will be shown in detail presently, along blade 24 at fixed intervals to indicate passage of distance as blade 24 is extended or retracted relative to a reference point on the casing 10. In the device shown, the optical markings are provided on the surface of blade 24 containing the conventional visual graduations and indicia, this surface being the one facing the interior of casing 10 as the blade travels along the passage 26, and the markings are located generally centrally along the blade between the parallel edges. There is provided means for irradiating the optical markings on blade 24 with light in the form of a source 36 of visible light and fiber optic bundles having one end located to receive light from the source and having the other end positioned closely adjacent the blade 24 in the region of the markings for illuminating the markings. In the measuring device shown, there is a first pair, one bundle designated 38b, and a second pair, one bundle designated 40b, of fiber optic bundles for illuminating spaced-apart regions of markings on the blade for reasons which will be described. The pairs of bundles 38, 40 extend through openings in the inner wall 28 in close-fitting relation so as to be supported thereby. Alternatively, a source of invisible light such as infrared radiation can be employed for irradiating the optical markings.

The measuring device further comprises photoelectric sensing means carried by casing 10 and operatively associated with the optical markings on blade 24 relative to a point of reference associated with the casing. The photoelectric sensing means is responsive to movement of the optical markings indicating passage of distance during movement of blade 24 for providing output signals at constant increments of distance during movement of blade 24. The photoelectric sensing means preferably comprises at least one photoelectric sensor element carried by the housing and a fiber optic bundle having one end operatively connected to the sensor and the other end positioned closely adjacent the measuring element or blade 24 in the region of the markings. Thus, the sensor is optically coupled to the markings by the fiber optic bundle. In the measuring device shown, there is provided a first pair of photoelectric sensors, one of which is designated 42b in FIG. 1, and a corresponding pair of fiber optic bundles, one of which is designated 44b, having one end operatively connected to the sensor 42b and the other end positioned closely adjacent the optical markings on blade 24. Each bundle extends snugly through an opening in wall portion 28 adjacent fiber optic bundle 38b so as to be supported thereby, and the end adjacent blade 24 also is closely adjacent the corresponding end of fiber optic bundle 38b. A second pair of photoelectric sensors, one of which is designated 46b, also is included along with a corresponding pair of fiber optic bundles, one of which is designated 48b. Each bundle is connected at one end to the corresponding sensor 46b and extends snugly through an opening in the wall 28 adjacent bundle 40b and terminates at the other end closely adjacent the markings on blade 24 and also closely adjacent the termination of bundle 40b. Thus, the photoelectric sensors are optically coupled to the markings on blade 24 at spaced locations for reasons to be described.

The photoelectric sensing means is operatively connected to readout means for converting electrical signals from the sensing means to an indication of the distance traversed by the blade 24, relative to a reference point on the casing 10. In the tape rule shown, the light source 36 and pairs of sensors 42 and 46 are plugged into receptacles on an internal housing, indicated diagrammatically at 50, for containing circuitry of the readout means, additional circuitry being contained within the internal housing diagrammatically shown at 52. Briefly, the readout means includes logic circuit means connected to the sensors 42, 46 for providing logic signals containing information of both extent and direction of movement of blade 24, counting means for providing an indication of the net distance traversed by blade 24, and a digital display indicated at 54 in FIG. 1 for providing a visual indication of the measured distance. Display 54 can be of the type readily commercially available, and is located in the tape rule shown adjacent an opening 56 provided in casing wall 14 and is supported by the curved inner wall 32. Also associated with the readout means are circuitry for converting the distance indication to selected units of measure and error detection circuitry, all of which will be described in detail presently. An electrical conductor 58 connects the circuitry within housing 50 to the display 54. Electrical power for operating the system components is provided by a battery 60 supported within the casing 10 adjacent the inner surface of the top wall 14 and the curved inner wall 32. Manually operated switches 62, 64 provide on-off control of the power supply and select modes of operation.

A number of advantages are provided by the optical system including the combination of the optical markings on blade 24 and the photoelectric sensing means optically coupled to the markings by the fiber optic bundles. The optical markings can be conveniently printed on tape 24 along with the human readable graduations and indicia. Furthermore, normal visual inspection by the user of the measuring device will indicate whether the markings have been damaged or worn during use. The photoelectric sensors and fiber optic bundles are readily commercially available and well known to those skilled in the art. The optical fibers are tubes of glass or clear plastic material which generally range in diameter from 0.002 to 0.05 inch and normally are bunched to form light transmission cables which advantageously are mechanically flexible. Optical fibers are commercially available for use with short transmission lengths which offer high efficiency in terms of packing factor and numerical aperture, i.e. the ability to accept light off the axis of the fiber without loss. Referring to the fiber optic bundles 38, 40 associated with light source 36 shown in FIG. 1, the fibers would be configured to the best geometry for acccepting light from source 36, and the fibers at the sensing point adjacent and spaced a short distance from blade 24 would be shaped in a geometry which is most efficient for illuminating the optical markings to be sensed. Adjacent the fiber optic bundles 38 and 40 are the bundles of optical fibers 44 and 48, respectively, to sense light reflected from the optical markings provided on the surface of blade 24. The optical fibers in the bundles 44 and 48 adjacent the surface of blade 24 are arranged to match properly and pick up most efficiently the light reflected from the optical markings. Employing the fiber optic bundles allows sensing of optical markings on blade 24 in a manner simplifying the optical and mechanical arrangement since the light source 36 and the photoelectric sensors 42 and 46 can be located at a convenient distance from the blade 24, and the bunching quality of the optical fibers can provide the configuration change between the light source and sensor and the optical markings to be sensed. The fiber optic bundles provide close but non-contacting optical coupling to blade 24 and are quite rugged and durable. In addition, the optical system in the measuring device of this invention is compatible with movement of tape blade 24 at speeds in a relatively wide range. For example, velocities measured during the return of steel tape rule blades have ranged from a maximum of around 19 mph to a minimum of zero, including very low velocities when making careful measurements. The optical system offers the advantage of static sensing whereby even a very slow movement of blade 24 will be accurately detected, and with commercially available photoelectric sensors the optical markings will be sensed even with very high velocities of blade 24.

FIG. 2A shows an illustrative form of optical markings on blade 24 in operative relation to the light source and photoelectric sensors, with only one pair of sensors shown for simplicity. In particular, the optical markings shown comprise adjacent areas of first and second optical characteristics in the form of adjacent light-absorbing and light-reflecting areas in cyclic relation along the blade 24. Furthermore, in the arrangement shown there are two neighboring or adjacent tracks or paths of the optical markings. Thus, one track includes a dark or light-absorbing area 70a of rectangular shape, an adjacent light-reflecting area 72a, another light-absorbing or dark area 70a, another light reflecting area 72a, and so on. In the arrangement shown, the areas 70a, 72a are of the same dimensions in a direction parallel to the longitudinal axis of blade 24. These alternating light and dark areas 72a and 70a, respectively, are in a track or path extending along the entire length of blade 24. The optical markings are illuminated by light from source 36 transmitted through the fiber optic bundle 40a, and the reflected and absorbed light levels as well as the sharp transitions therebetween are sensed by the photoelectric sensor 46a which is optically coupled through the fiber optic bundle 48a to the track of optical markings 70a, 72a. An adjacent or neighboring second track of optical markings comprises alternating dark or light-absorbing areas 70b and light-reflecting areas 72b. The light-absorbing or dark areas 70b are of the same size and shape as the areas 70a in the adjacent track and, likewise, the light-reflecting areas 72b are of the same size and shape as the light-reflecting area 72a of the adjacent track. The transitions between areas 70, 72 in the respective tracks are not in alignment but rather offset or staggered laterally relative to the longitudinal axis of tape 24. The transitions between the areas of the first and second optical characteristics, i.e. light and dark areas, are at constant fixed intervals along each track on the blade 24 and are disposed perpendicular to the longitudinal axis of the blade.

The optical markings shown advantageously can be printed on blade 24 in a manner similar to the application of the standard graduations and indicia. The dark areas 70a, 70b can be solid black the same as the graduations and indicia and the light areas 72a 72b simply can be the unprinted tape surface which generally is colored for contrast, for example yellow. Also, the optical markings can be provided in various other ways, for example by means of spaced apertures along blade 24.

The photoelectric sensors 46a and 46b shown in FIG. 2A each provide a signal of a first type when exposed to the areas 70 of the first optical characteristic and a signal of a second type when exposed to the areas 72 of the second optical characteristic, in a known manner. Transitions between the signals occur in response to sensed transitions between areas of the different optical characteristics along the series of markings. The transitions are at constant increments of distance along blade 24. Furthermore, the sensors 46a and 46b are optically coupled to the markings, in the system shown by means of the fiber optic bundles 48a and 48b, respectively, in a manner such that only one of the transitions between optical areas is sensed by any one of the sensors at a given time. As shown in FIG. 2A this results from the lateral alignment of the terminations of the fiber optic bundles adjacent blade 24 in combination with the offset optical markings in the two tracks. For example, in the arrangement shown in FIG. 2A, sensor 46a is optically coupled by fiber optic bundle 48a to a light area 72a while sensor 46b is optically coupled by fiber optic bundle 48b to a dark area. As blade 24 moves to the left as viewed in FIG. 2A, sensor 46a firt detects the transition from the light area 72a to the dark area 70a while sensor 46b remains optically coupled to the dark area 70b. Upon further movement of blade 24 to the left sensor 46b detects the transition from the dark area 70b to the light area 72b while sensor 46a still is optically coupled to the dark area 70a.

By virtue of this phased arrangement of the photoelectric sensors and the optical markings, the system keeps track of the number of increments of distance travelled by blade 24 relative to the housing 10, i.e. by detecting the transitions which represent increments of distance, while at the same time keeping track of the direction of movement of blade 24 relative to housing 10 so that distance travelled in a reverse direction, i.e. blade 24 retracted toward housing 10, can be subtracted from forward blade movement to indicate net distance traversed by the blade. The latter is a result of the photoelectric sensors generating signals in a cyclic code depending upon direction of blade movement in a manner which will be described. An advantage of employing fiber optic bundles in the foregoing arrangement is that the photoelectric sensors can be mounted permanently in a convenient location in housing 10 and the phase relationship can be established and even changed at a later time, if necessary, solely by changing the physical locations of the ends of the flexible fiber optic bundles, within reasonable limits, with no need to move the photoelectric sensor devices.

Figure 2B:
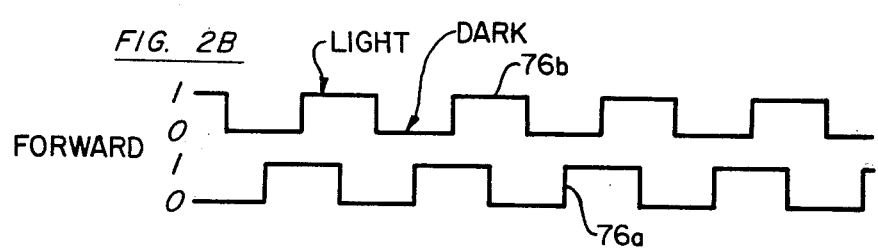
FIGS. 2B and 2C are graphic views of waveforms illustrating the time sequence of signals derived from the photoelectric sensors shown in FIG. 2A in response to movement of the blade in the forward and reverse directions.
Figure 2C:
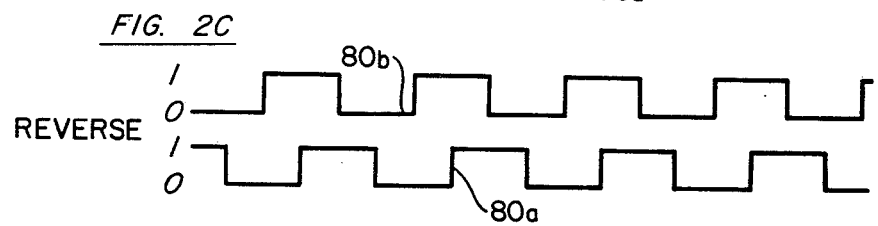

FIGS. 2B and 2C show the manner in which the phased arrangement of optical markings and photoelectric sensors generates signals in a cyclic code containing directional information. The waveforms 76a and 76b in FIG. 2B illustrate the time sequence of pulses derived from sensors 46a and 46b, respectively, when the blade 24 containing the optical markings 70, 72 is moved to the left as viewed in FIG. 2A. This is forward or outward movement of blade 24 relative to casing 10 as seen from the relative location of sensors 46 to source 36 observed from FIG. 1 in relation to FIG. 2A. As shown in FIG. 2A, as the blade and optical markings move to the left, transitions between light levels are detected by sensor 46b prior to sensor 46a. As shown in FIG. 2B pulses 76b derived from sensor 46b lag in phase the pulses 76a derived from sensor 46a. The phase difference is established by the staggered or offset relation of the two tracks of optical markings relative to the sensors. For purposes of illustration, each waveform 76a, 76b in FIG. 2B is identified further with logic 1 and logical 0 levels in a positive logic mode corresponding to the light and dark areas, respectively, detected on blade 24. Thus, beginning at the far left in FIG. 2B and proceeding to the right corresponding to forward blade movement over time, the following logic signal combinations are derived from sensors 46a. 46b: 01, 00, 10, 11, 01, 00, 10, etc. In each combination, the first bit represents the signal derived from sensor 46a and the second bit the signal derived from sensor 46b. The foregoing sequence of signal combinations is in a 2 bit cyclic code corresponding to forward movement of blade 24. In a similar manner, the waveforms 80a and 80b in FIG. 2C illustrate the time sequence of pulses from sensors 46a and 46b, respectively, corresponding to movement of blade 24 to the right as viewed in FIG. 2A. This corresponds to retraction of blade 24 into casing 10 as viewed in FIG. 1. As the blade and optical markings move to the right, transitions between light levels are detected by sensor 46a prior to sensor 46b. Proceeding through an analysis similar to that for FIG. 2B, it is seen that the following logic signal combinations result as the blade moves to the right: 10, 00, 01, 11, 10, 00, 01 etc. The foregoing sequence of signals is a 2 bit cyclic code corresponding to rearward movement of blade 24. Thus, by employing signals containing information both as to the number of transitions and direction of blade movement, the net forward distance traversed by blade 24 relative to casing 10 can be indicated. In other words, by appropriate logic circuit means which will be described, the number of pulses counted during movement of blade 24 will keep absolutely in step with the position of blade 24 regardless of when or where the blade is reversed and no matter how many times.

Figure 3:
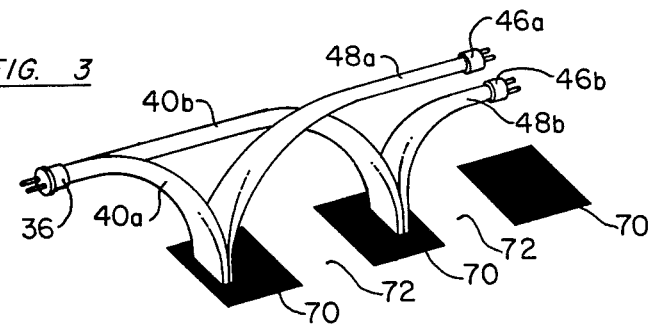
FIG. 3 is a diagrammatic view illustrating one relationship between a single pair of photoelectric sensors and the optical markings in the tape rule of FIG. 1 to provide signals indicative of both extent and direction of blade movement.

FIG. 3 illustrates an alternative arrangement wherein the optical markings are provided on blade 24 in a single path or track, and the optical coupling of the pair of photoelectric sensors is in a manner providing signals indicating increments of distance traversed by the blade and which are cyclically coded with information of blade movement. In particular, the optical markings comprise a single track of alternating dark 70 and light 72 areas identical to one of the paths or tracks in the arrangement of FIG. 2A. The fiber optic bundles 48a and 48b are positioned relative to the optical markings to couple the sensors 46a and 46b, respectively, to the markings in a manner such that a transition between areas is detected by only one of the sensors at any given time. For purposes of illustration it will be assumed that a logical one output signal is derived from a sensor optically coupled to a light area 72 and a logical zero signal is derived from a sensor optically coupled to a dark area 70. In the initial position shown in FIG. 3, each sensor 46a and 46b providing a logical zero output signal. As blade 24 moves to the left as viewed in FIG. 3, transitions between light levels are detected by sensor 46b prior to sensor 46a. The sequence of logical signals beginning with the position of FIG. 3 is as follows: 00, 01, 11, 10, 00 etc wherein the first bit represents the signal derived from sensor 46a and the second bit the signal from sensor 46b. Upon movement of blade 24 in a right-hand direction as viewed in FIG. 3 the sequence of logical signals derived from sensors 46a and 46b beginning with the initial position is as follows: 00, 10, 11, 01, 00 etc. Thus, by comparing the two sequences of logical signals it is seen that they are cyclically coded with directional information in a manner similar to that of the arrangement of FIG. 2A.

Figure 4:
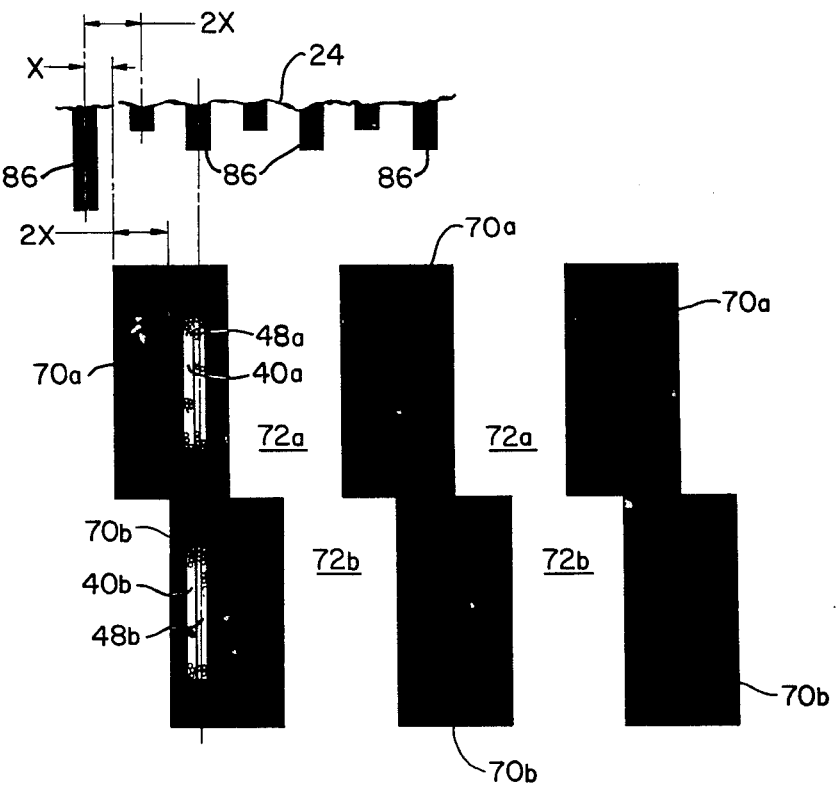
FIG. 4 is an enlarged diagrammatic view illustrating the measuring element or blade of the tape rule of FIG. 1 provided with both optical markings and conventional graduations and showing terminations of the fiber optic bundles.

FIG. 4 illustrates dimensional relationships between the optical markings 70, 72 and conventional visually readable graduations 86 printed on the blade 24. The distance 2X is the measured distance between the center lines of adjacent graduations 86, and in order to provide a desired accuracy of plus or minus the quantity X, a counting interval of 2X on the optical markings is required. In a typical tape rule measuring device it is desired to provide an accuracy of plus or minus 0.010 inch, and this requires a counting interval of 0.020 inch in the device of the present invention. The signal pickups can offset slightly so that the signal change, ideally or theoretically, will take place half way between the actual printed divisions on tape 24 so that theoretically an exact dimension plus or minus 0.010 inch can be attained. The optical markings are printed along a path generally centrally or midway between the opposite edges of blade 24 to take advantage of the natural protection provided by the arcuate or concave cross section of blade 24. Furthermore, this allows sufficient room to provide the conventional visually readable graduations 86 on the edges of the blade 24. FIG. 4 also shows terminations of optical fibers in the bundles 40a and 40b connected to the light source 36 and in the bundles 48a and 48b connected to the sensors 46A and 46B, respectively. The terminations of the fibers in the bundle connected to the light source, which also can be designated the source fibers, can be positioned together and separate from the terminations of the fibers of the bundles connected to the sensors, which also can be designated the sink fibers. Alternatively, the terminations of the source and sink fibers can be in a random arrangement adjacent the blade surface. FIG. 4 also illustrates the relatively small area of each fiber optic bundle termination as compared with the size of the areas 70, 72 of the optical markings. This together with the close spacing between blade 24 and fiber optic terminations insures highly accurate detection of the optical marking transitions.

Figure 5A:
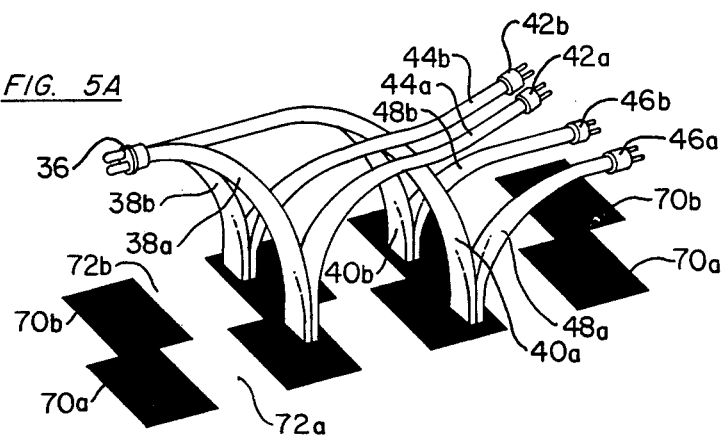
FIG. 5A is a diagrammatic view illustrating an arrangement of the photoelectric sensors and optical markings on the blade for error detection in the tape rule of FIG. 1.

If the detection system comprising the photoelectric sensors and fiber optic bundles fails to sense an optical marking or group of markings on blade 24 or if a scratch on the blade is detected as an optical marking, then the utlimate digital readout of the measured length will be in error. In providing error detection for the measuring device, an important consideration is that the velocity of blade 24, and therefore the pulse repetition rate, can vary from zero to a very high value. In particular, velocity measured during the return of a steel tape rule blade has ranged from a maximum of around 19 mph to minimum velocities of very low values including zero. This, in turn, gives a range of time duration per 0.020 inch count interval of about 60 microseconds to infinity or an extremely wide range of durations. In order to detect errors under such conditions, in the measuring device of this invention duplicate pairs of sensors and logic circuitry are provided, and signals associated with the two pairs or channels are monitored by circuitry which indicates an error when the difference in signals exceeds a predetermined value. Such an arrangement of duplicate pairs of sensors is shown in FIG. 5A. The optical markings 70 and 72 are similar to those in the arrangement in FIG. 2A and are provided along two neighboring or adjacent tracks a and b in laterally offset or staggered relation. Similarly, light source 36, fiber optic bundles 40a, 40b, photoelectric sensors 46a and 46b and fiber optic bundles 48a and 48b are identical to those in the arrangement of FIG. 2A. The terminations of bundles 48a, 48b closely spaced from blade 24 are in lateral alignment. The arrangement of FIG. 5A additionally includes the second pair of photoelectric sensors 42a and 42b and corresponding fiber optic bundles 44a and 44b, respectively, for coupling the sensors to the optical markings shown in FIG. 1. The terminations of bundles 44a, 44b closely spaced from blade 24 are in lateral alignment. In addition, the ends of the fiber optic bundles 44a and 44b are displaced axially and laterally relative to the terminations of the fiber optic bundles 48a and 48b. The light from source 36 also is coupled by fiber optic bundles 38a and 38b to the regions of the markings adjacent the terminations of bundles 44a and 44b.

The arrangement thus provides two complete photoelectric sensing systems in the form of duplicate pairs of sensors or channels which also will be designated M and N. Both pairs of sensors activate corresponding logic circuit means but only one of the channels, and it can be either, will be utilized to extract information of the net distance traversed by blade 24. Simultaneously a supervisory logic, which will be described in detail presently, monitors the signal units generated by each of the channels, and if at any time the difference in signal units generated by the two channels exceeds a predetermined amount, which in the system shown is one unit, an error alarm will be set to warn the user of the tape rule device that the displayed length indication is incorrect. Although within each of the channels containing a pair of sensors the signals read from blade 24 are cyclic with only one signal changing at a time, the two channels may not always generate signals at exactly the same time, especially at the slow speeds under which the system must operate. For this reason a disparity of one signal unit must be allowed, and such an approach will work under all circumstances of blade speed, and direction. Thus, the system essentially is a single error detecting system which will register an error whenever a false reading occurs in either of the channels, the false reading of course being due to either or both sensors failing in the particular channel. The particular arrangement of the photoelectric sensor pairs in the two channels, such as the one illustrated in FIG. 5A, will depend upon the nature of the types of errors or faults which might occur on the printed optical markings on blade 24. The proper choice in number of periods or count intervals of axial displacement will insure that errors covering the entire width of the track will not interact between the two systems. Axial displacement of the sensor pairs is preferred for the reason that false readings resulting from lateral scratches across the printed track will be properly detected.

Figure 5B:
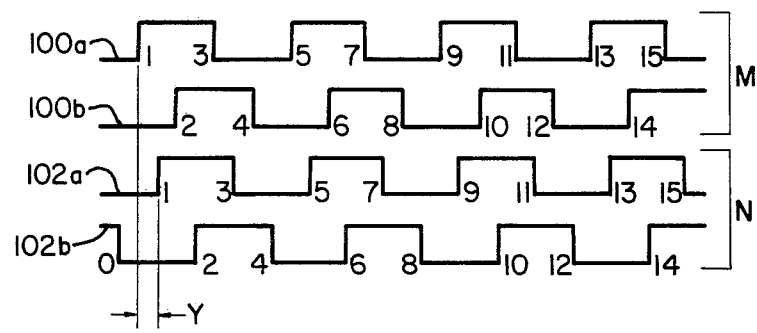
FIG. 5B is a graphic view of waveforms illustrating a time sequence of signals derived from the photoelectric sensors in the arrangement of FIG. 5A during movement of the blade in one direction.

The waveforms in FIG. 5B illustrate the time sequence of signals from the sensors 42a, 42b and 46a, 46b in the arrangement of FIG. 5A during movement of blade 24 in a direction to the left as viewed in FIG. 5A. In particular, waveforms 100a and 100b illustrate signals derived from sensors 42a and 42b, respectively, which for convenience also are designated as signals of the M channel. A total of 15 counts is shown in FIG. 5B corresponding to a total of 15 transitions detected by the two sensors 42a and 42b during leftward movement of blade 24 over the distance containing the optical markings shown. Similarly, waveforms 102a and 102b illustrate signals derived from sensors 46a and 46b, respectively, which detect a corresponding number of transitions to provide the same number of counts as indicated. These signals are identified with the N channel. The time interval designated Y in FIG. 5B between the sensors of the two channels arises from a lack of mechanical synchronization or alignment between the sensing means of the two channels. This time interval generally will be small compared to the time interval between signal transitions, but it is exaggerated in FIG. 5B for purposes of clarity.

Figure 5C:
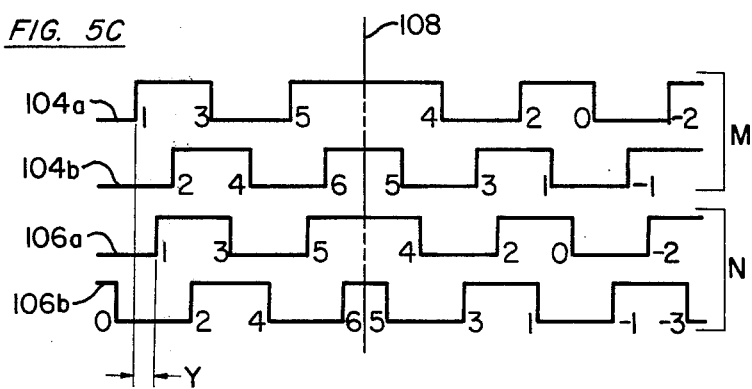
FIG. 5C is a graphic view of waveforms illustrating a time sequence of signals derived from the photoelectric sensors in the arrangement of FIG. 5A when the blade movement changes in direction.

The waveforms in FIG. 5C illustrate movement of the blade 24 initially to the left as viewed in FIG. 5A followed by a reversal of direction and then movement to the right as viewed in FIG. 5A. Waveforms 104a and 104b are signals derived from the sensors 42a and 42b, respectively, which also are identified with the M channel. Waveforms 106a and 106b are signals derived from the sensors 46a and 46b, respectively, which are identified with the N channel. The time interval Y between channels arises from lack of mechanical synchronization or alignment and is exaggerated in width for clarity as in FIG. 5B. Thus, the blade moves in a leftward direction as viewed in FIG. 5A up to the point in time indicated by line 108 in FIG. 5C. Accordingly, until then waveforms 104 and 106 are identical to waveforms 100 and 102, respectively, in FIG. 5B. At the point in time indicated by line 108, blade 24 moves to the right as viewed in FIG. 5A and the sensors produce the time sequence of signals shown. It will be noted that since channel N lags behind channel M during movement of blade 24 in a leftward direction, channel N will lead channel M in the opposite direction of movement of blade 24 by the same time interval Y. Also indicated on the waveforms in FIG. 5C is the net number of counts arising from the transitions detected by the sensor pairs 42 and 46. The net number of counts indicated in FIG. 5C is the result provided by the combination of logic circuitry and counting means which will be described in detail presently. Furthermore, because of the time lead or lag between the channels, a reversal occuring at a different time may cause a pair of signal transitions in one channel, for example the 6-5 count of waveform 106b, to be missing entirely, even though the mating pair of transitions, i.e. those in waveform 104b, may be present. Even under these conditions the disparity in count between the two channels never will be greater than one count, unless of course an error is being detected.

Figure 6A:
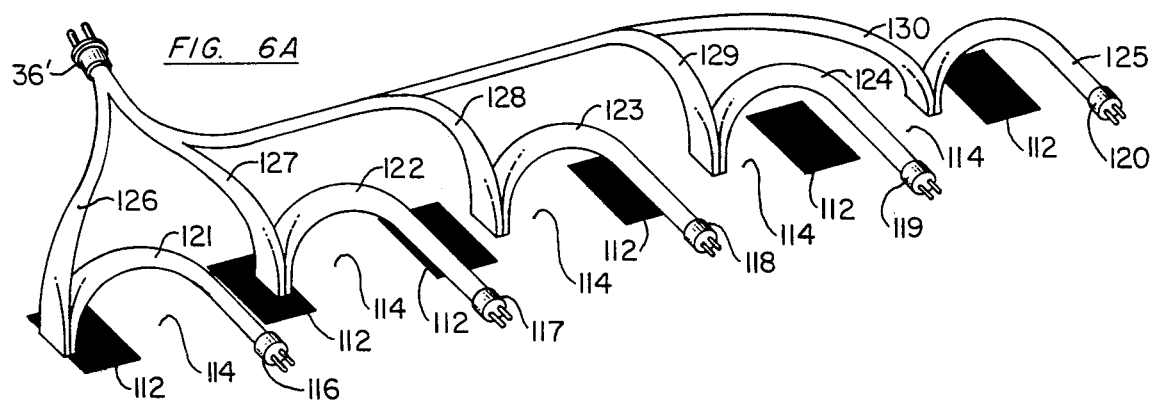
FIG. 6A is a diagrammatic view of an alternative arrangement of photoelectric sensors and optical markings in a Vernier configuration applicable to the device of FIG. 1.

FIG. 6A illustrates the optical markings and the sensors arranged according to a vernier approach wherein the number of sensors is one less than the number of optical markings or graduations. Thus, the optical markings can comprise a series of alternating dark and light areas 112 and 114, respectively, or alternatively the optical markings can be actual printed scale graduations. There are six optical markings shown in the arrangement of FIG. 6A and five photoelectric sensors 116-120 each being identical to the photoelectric sensors designated 42 and 46 in the previous embodiments. The photoelectric 116-120 are optically coupled to the optical markings by means of fiber optic bundles 121-125, respectively, which are identical to the fiber optic bundles illustrated in the previous embodiments. A single light source 36' can be employed for illuminating the regions of the blade containing the optical markings which source is optically coupled to the markings by means of fiber optic bundles 126-130 which are similar to the fiber optic bundles illustrated in the previous embodiments. The terminations of corresponding fiber optic bundles from the light source 36' and from the sensors are closely adjacent, and the areas of the terminations are considerably smaller than the areas 112, 114 of the optical markings.

Figure 6B:
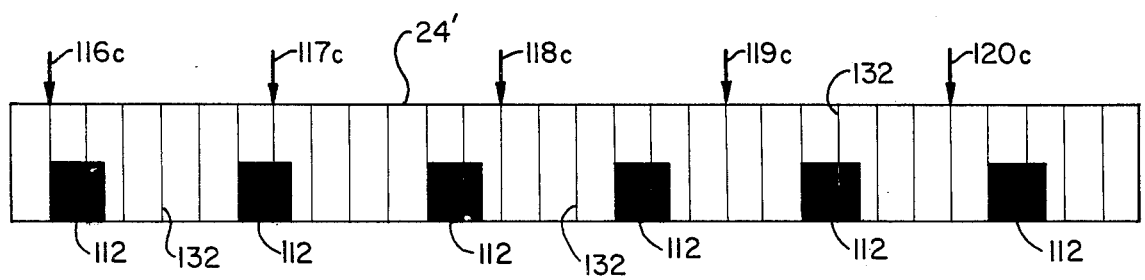
FIG. 6B is a diagrammatic view illustrating the spatial relationship between the center lines of the photoelectric sensor pickups and the graduations and optical markings in the arrangement of FIG. 6A.

FIG. 6B illustrates diagrammatically the spatial relationship between the center lines of the optical pickups or sensors in relation to the optical markings on a blade or measuring element 24'. The optical markings are designated 112, and it is to be noted that these could comprise actual printed scale graduations. The arrows designated 116c-120c represent the location of the center lines of the termination of the fiber optic bundles coupling the corresponding photoelectric sensors 116-120, respectively to the optical markings. Lines 132 on blade 24' represent additional graduations.

Figure 6C:
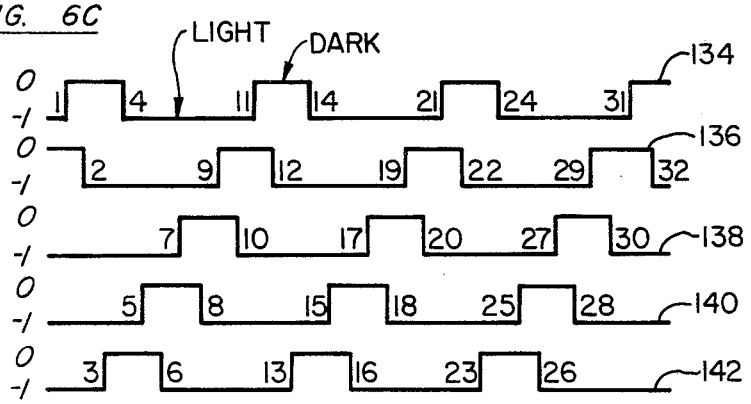
FIG. 6C is a graphic view of waveforms illustrating the time sequence of signals derived from the photoelectric sensors in the arrangement of FIG. 6A in response to movement of the blade bearing the optical markings.

The waveforms in FIG. 6C represent the time sequence of pulses derived from the photoelectric sensors in response to movement of the blade containing the optical markings to the left as viewed in FIG. 6A. In particular, waveforms 134, 136, 138, 140 and 142 represent time sequence of pulses derived from photoelectric sensors 116, 117, 118, 119 and 120, respectively. For convenience in illustration each of the waveforms is provided with an identication of logical zero and logical minus one levels at the left hand end of FIG. 6C, and in the waveforms shown negative logic is employed, wherein a logical minus one output signal corresponds to the photoelectric sensor being coupled to a light area, as contrasted with the waveforms in the previous embodiment. The counts ultimately derived from the logic circuitry and counting means also is indicated in FIG. 6C. The foregoing vernier arrangement would appear to be advantageous in reading from existing scale graduations on measuring elements and would appear to have increased accuracy for a given number of graduations or may have the same accuracy with fewer and more widely spaced graduations.

Figure 7:
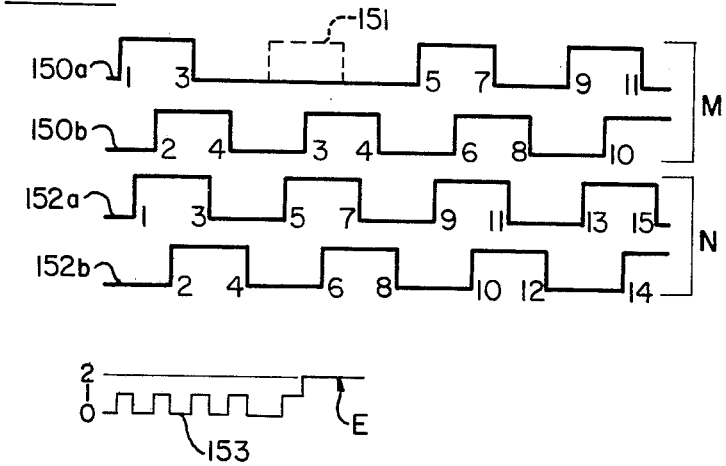
FIG. 7 is a graphic view of waveforms illustrating a time sequence of signals derived from the photoelectric sensors similar to FIG. 5B and illustrating the indication of an error condition.
Figure 8A:
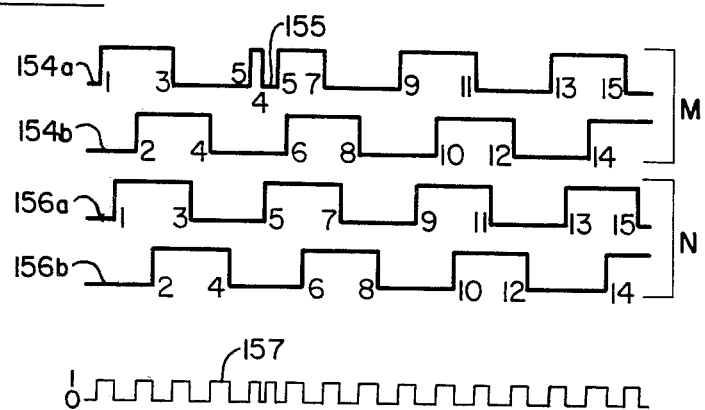
FIG. 8A is a graphic view of waveforms illustrating a time sequence of signals similar to FIG. 7 wherein the error condition is self-correcting and not indicated.
Figure 8B:
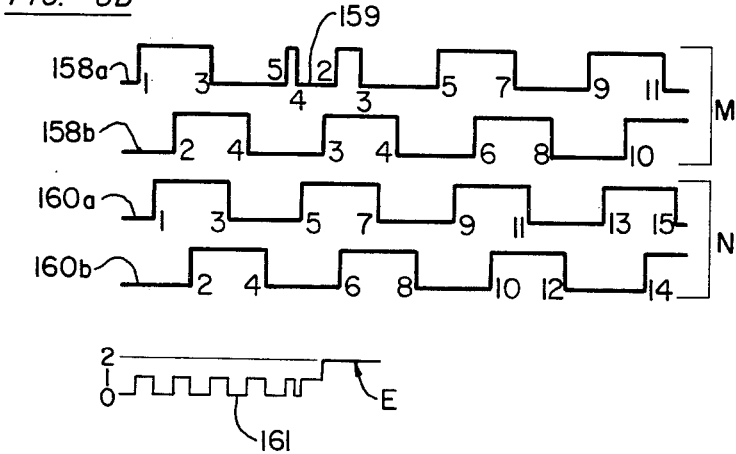
FIG. 8B is a graphic view of waveforms illustrating a time sequence of signals similar to FIG. 8A but wherein the error condition is indicated.

FIGS. 7, 8A and 8B are waveforms of the type shown in FIGS. 5B and 5C for the arrangement of FIG. 5A which in the present instance illustrate operation of the system under various error conditions. As previously mentioned, the signals from one of the sensor pairs or channels, either M or N, are counted to give an indication of net distance traversed by the blade 24 which indication is suitably displayed. Also, the information from both channels M and N is compared and when the difference in counts is greater than a predetermined amount, in the present instance greater than one count, an error is signaled. The error detection and signaling circuitry will be described in further detail presently. Referring now to FIG. 7, the waveforms illustrate time sequence of signals arising when the blade in the arrangement of FIG. 5A moves to the left. The waveforms of FIG. 7 illustrate the error situation where the sensor 42a completely misses an optical marking, and the corresponding missing pulse is shown in broken lines at 151. This could arise, for example, due to the damage to the blade obliterating an optical marking. It is seen that waveforms 152a and 152b are identical in shape and resulting in the same count indications as waveforms 102a and 102b in FIG. 5B. Waveform 150b, while being identical in form to waveform 100b, gives rise to different count information due to the fact that an optical marking is missed by sensor 42a and the corresponding pulse is absent in waveform 150a. The missing pulse in waveform 150a causes channel M portion of the system to appear as though it has reversed direction whereas the channel N portion has not, which accounts for the large disparity in counts occurring so quickly. Waveform 153 represents the difference or disparity in counts between the signals of channel M and those of channel N as determined by the error detection circuitry. Up until the occurrence of the missing pulse 151, the difference is only one as indicated by the pulses in signal 153. Then the disparity in count rises quickly, and in accordance with the present invention, when the difference in counts is greater than one, i.e. when the waveform 153 reaches the level corresponding to a count difference of two as indicated in FIG. 7, an error signal level results as indicated by the letter E.

The waveforms of FIG. 8A illustrate a situation where a scratch or the like on blade 24 is either of a size or in a location such that it does not signal an error. In particular, a scratch or marking on the track associated with sensor 42a affects the waveform 154a by causing a transition interval 155 of relatively short time duration. Comparing the waveforms 154a and 154b it is seen that the transition interval is sufficiently short in time so that it does not overlap in time the next transition in waveform 154b. Accordingly, no disparity in counts greater than one arises as indicated by the waveform 157 and no error is signaled. The scratch in effect causes the system to detect two graduations or optical markings but an error of this type is essentially self-correcting due to its location and/or size. The net result is that the waveforms 154a, 154b and 156a, 156b are essentially identical to the waveforms 100a, 100b and 102a, 102b, respectively, in FIG. 5B.

The waveforms of FIG. 8B illustrate a situation similar to that of FIG. 8A but where the scratch or marking is so located or of sufficient size to signal an error. The scratch again occurs on the track of optical markings associated with sensor 42a as indicated in waveform 158a where the scratch causes the transition interval indicated 159. In this situation the scratch is of a nature such that transition interval 159 is of sufficient time duration to overlap in time the transition occurring in waveform 158b of signals derived by photosensor 42b. As a result, a disparity in count quickly occurs as indicated by the waveform 161 and an error is signaled by the level E where the count difference is greater than one.

As an alternative to the arrangement of sensors and optical markings of FIG. 5, the two pairs of sensors can be arranged axially along a single track of optical markings. The phase relationship is obtained by the axial spacing of the four sensors. An advantage of this arrangement is that a scratch, dirt streak and the like disposed generally transverse on the pattern is less likely to disturb the signals and generate an error indication because it alone will affect only one sensor at a time, not a pair of sensors simultaneously. Thus, two transverse scratches, dirt streaks and the like would have to exist at a proper axial spacing on the track of optical markings in order to affect a pair of sensors simultaneously. Accordingly, this arrangement has the capability of tolerating more scratches and dirt streaks on the blade without miscounting and signaling an error. Another advantage is that it allows a relatively narrrower overall pattern of optical markings to be employed.

Figure 9:
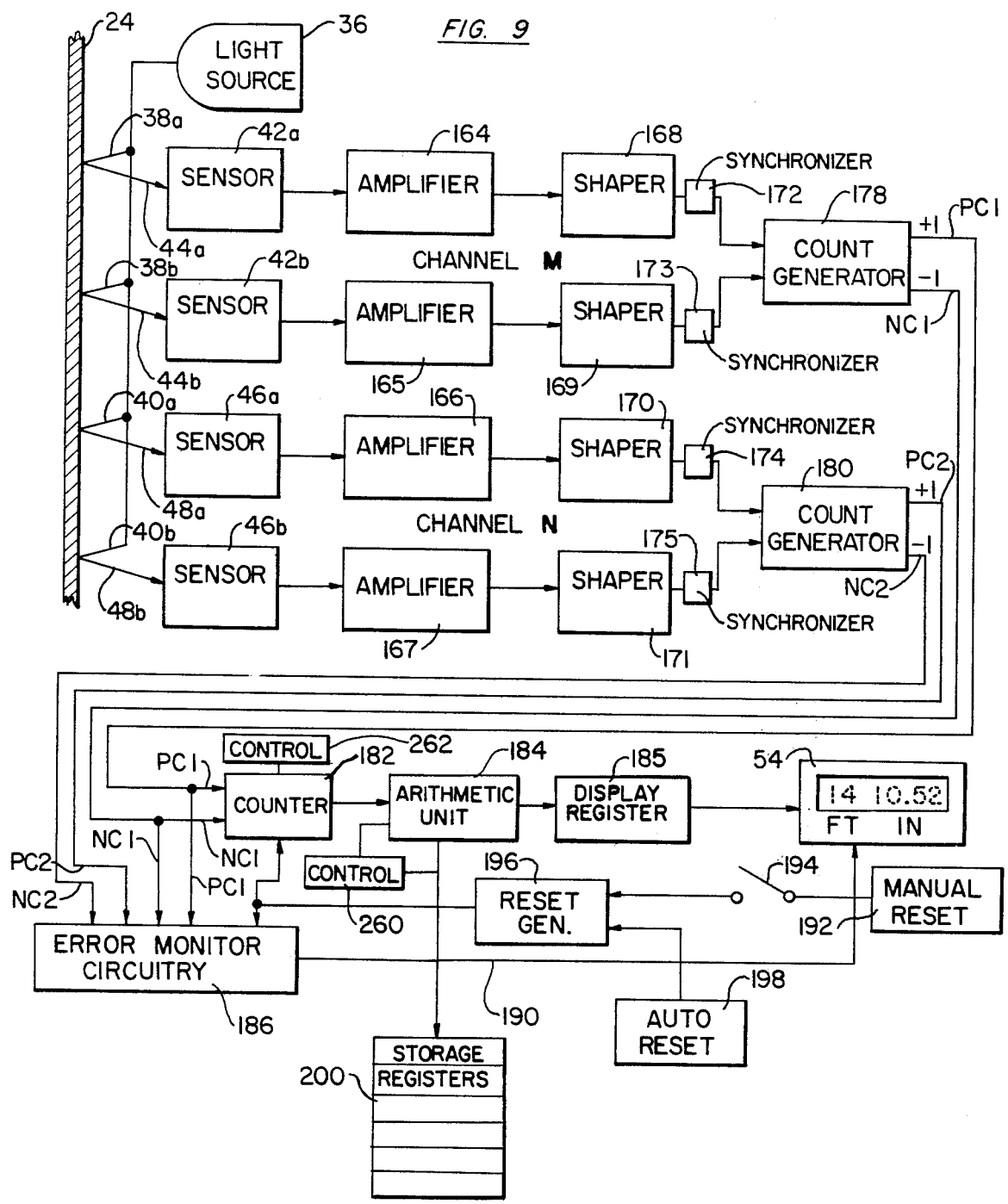
FIG. 9 is a schematic system block diagram of the measuring apparatus according to the present invention.

FIG. 9 is a schematic system block diagram of the digital tape rule of FIG. 1 including the arrangement of light source sensors and fiber optic bundles of FIG. 5A. The outputs of the sensors 42a, 42b, 46a, and 46b are connected to the inputs of amplifiers 164–167, respectively, the outputs of which, in turn, are connected to the inputs of shaper circuits 168–171, respectively. The shaper circuits 168–171 preferably are of the well-known Schmitt trigger type. The outputs of the shaper circuits 168–171, in turn, are connected to the inputs of synchronizing circuits 172–175, respectively, which function to synchronize the incoming signals with a source of system clock pulses (not shown) in a manner which will be described. The outputs of synchronizing circuits 172 and 173 are connected to the inputs of a count generator designated 178 for providing output signals including information as to both increments of distance traversed by blade 24 and the direction of blade movement in a manner which will be described. These output signals are designated PC1 and NC1 in FIG. 9.

The combination of sensors 42a, 42b, amplifiers 164, 165, shapers 168, 169, synchronizers 172, 173 and count generator 178 is designated channel M. The outputs of synchronizers 174 and 175 are connected to the input of a count generator 180 identical to count generator 178. The output signals from count generator 180 are designated PC2 and NC2 in FIG. 9. The output signals from one of the two channels, specifically signals PC1 and NC1 from count generator 178 of channel M, are connected to the inputs of an up-down counter 182. Counter 182 is of a type readily commercially available, and a five decade counter is compatible with a tape rule having a blade length of 25 feet with optical markings at 0.020 inch intervals thereby requiring a maximum of 15,000 counts. With longer tapes or finer markings a larger counter would be used. In particular, the signal PC1 is connected to the up input terminal and the signal NC1 is connected to the down input terminal of counter 182. The output of the counting means 182 is connected to the input of an arithmetic unit 184 for converting the counts into units of measure. The arithmetic unit 184 will be described in detail presently. The output of arithmetic unit 184 is connected to the input of a display register 185, the output of which is connected to the digital display element 54 which can be of various readily commercially available types. In the system shown the display 54 is presenting a distance in English units of measure.

All of the outputs of both count generators 178 and 180 are connected to inputs of the error monitor circuitry 186 in FIG. 9, the construction and operation of which will be described in detail presently. The output of the error monitor 186 is connected by line 190 on an error indicator associated with display 54. A reset signal source designated 192 is connected through a manually operated switch 194 to one input of a reset generator 196. An automatic reset component 198 is connected to another input of the reset generator 196. The output of generator 196 is connected both to the error monitor circuitry 186 and to the counter 182. The construction and operation of the reset arrangement will be described in detail presently. A stack 200 of storage registers, in the present illustration six registers, is operatively connected to arithmetic unit 184.

A preferred form of each of the synchronizing circuits 172-175 includes, for each synchronizer, a JK flip-flop element with the central system clock pulse generator (not shown) being connected to the clock pulse input, the output signal from the corresponding one of the shaping circuits being connected to the J input of the flip-flop and also being connected through an inverter to the K input of the flip-flop. Both the true and complement outputs on the flip-flop are applied to the count generator 178, although for simplicity in illustration a single line is shown from each synchronizer circuit to the count generator in FIG. 9. As a result, regardless of when the signal from the shaping circuit undergoes a transition, the output signal from the synchronizer always undergoes a transition just after the fall of the next clock pulse following the input transition. Thus the signals applied to the inputs of the count generators 178 and 180 are synchronized with the internal system clock pulse generator. In the tape rule measuring device shown, the clock pulse generator produces an output train of pulses having a frequency of about 500 kiloherz to provide a capability in performing rapid unit conversions, although a 50 kiloherz clock rate is believed to be sufficient in most situations.

Figures 10, 11:
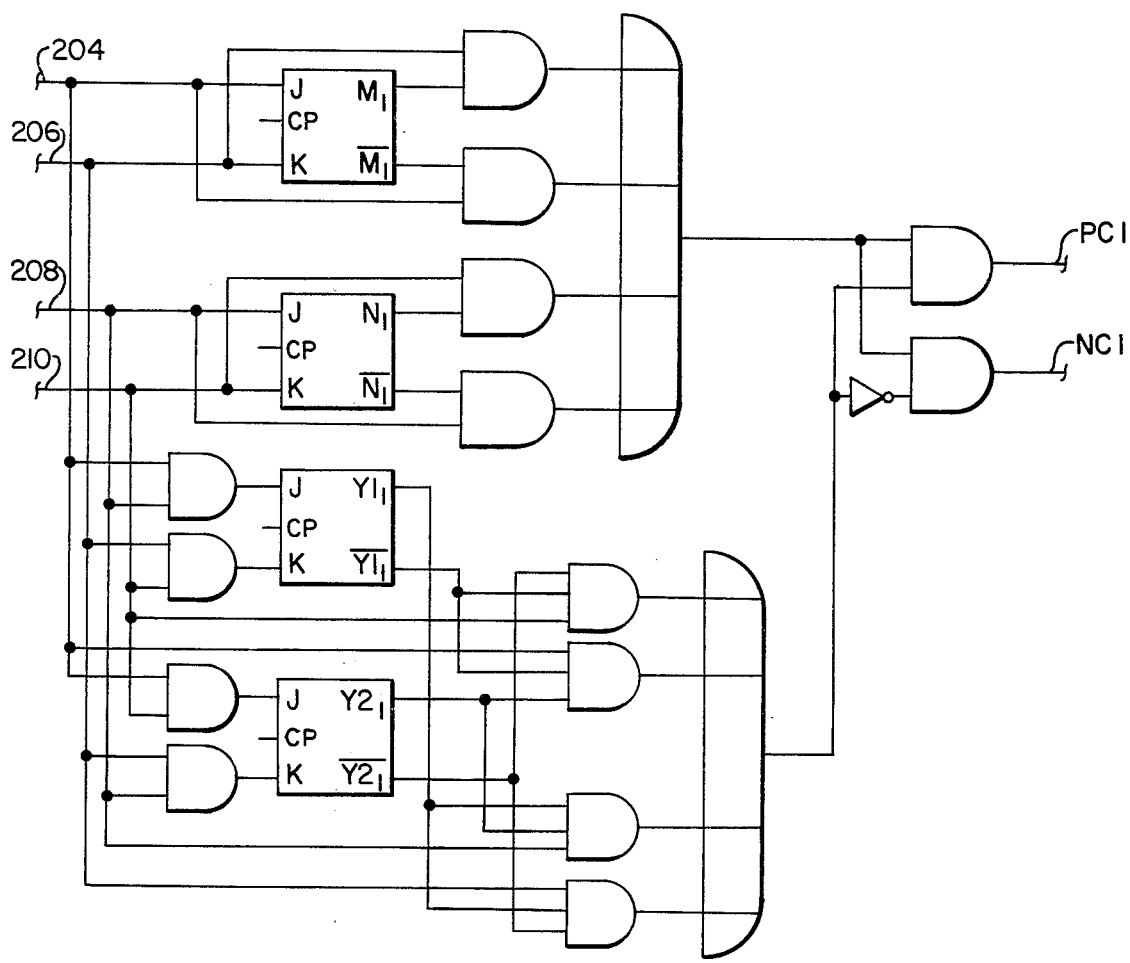
FIG. 10 is a logic state table illustrating the operation of one of the count generators in the system of FIG. 9.
FIG. 11 is a schematic diagram of logic circuitry for implementing one of the count generators in the system of FIG. 9.

FIG. 10 is a logic state flow table illustrating the function and operation of one of the count generators, for example generator 178, it being understood that the operation of the other count generator 180 is identical. The count generator 178 is a sequential circuit having two inputs designated a and b in FIG. 10 which are derived from the signals from the photoelectric sensors 42a and 42b, and having two outputs which are designated PC and NC in FIG. 10 and which correspond to signals PC1 and NC1 in FIG. 9. Being a sequential circuit, the count generator has an output which depends not only on the input at any given time but also on the past history or sequence of the inputs which is stored inside the sequential circuit and designated as the internal state of the circuit. In other words, the count generator circuit conforms to two basic defining equations: the output is determined by the input and the present internal state; and the next internal state is determined by the input and the present internal state.

The table of FIG. 10 is arranged with the possible b, a input signal combinations across the top: 00, 01, 11, 10. The internal states of the circuit are labelled W, X, Y, and Z, and these states are represented in the actual circuit by two flip-flops designated FF1 and FF2 with the state combinations being designated: 00, 01, 11 and 10 in the left-hand half of the table. The numbers inside the right-hand portion of the table represent the total state of the circuit, each total state being a combination of one input state with one internal state. The total state, hereafter referred to simply as the state to distinguish it from the internal state of the circuit, can be an unstable state shown in the table as an uncircled number or a stable state shown as a circled number. While an unstable state is transient only and will resolve itself into a definite predetermined stable state, the only way a change can be made from one stable state to another is to change the input to cause horizontal movement in the table to either a new stable state or to an unstable state which then will resolve itself into a new stable state. Furthermore, an unstable state always resolves itself into the stable state of the same number.

By way of illustration, with a given b, a input combination, for example 01, and with the circuit in a given stable state, for example (2), no changes will occur and the circuit will remain stable. If the inputs change from 01 to 11, the operation point of the circuit changes from (2) in row X to the unstable state 3 in row X for the column corresponding to input 11. The unstable state 3 resolves itself into the stable state (3) in row Y. At that time the circuit will generate a pulse PC and then rest in that condition so long as the input does not change.

The action of the count generator circuit in response to an input sequence of signals representing forward motion of the tape 24 is as follows. Assume that the state of the circuit is the stable state (1) in row W and the input sequence of b, a signals is 00, 01, 11, 10, 00, 01 etc. This sequence of signals is the same as that derived from the waveform in FIG. 2B, accounting for the transposition from a, b in FIG. 2B to b, a in FIG. 10. The state sequence will proceed as follows. When the input changes from 00 to 01 the circuit state changes from (1) to the unstable state 2 in row W which resolves itself into the stable state (2) in row X generating a PC pulse. This indicates one increment of distance traversed by blade 24 in a forward direction. The circuit waits until the input changes from 01 to 11, at which time the state changes from (2) to the unstable state 3 which then resolves to the stable state (3) in row Y and generates a PC pulse. This indicates another increment of forward blade movement. The circuit waits until the input changes to 10, at which time the circuit state changes from the stable state (3) to the unstable state 4 whereupon it resolves to the stable state (4) in row Z and generates a PC pulse, indicating another increment of forward blade movement. When the input changes to 00, the circuit state changes to the unstable state 1 and then to the stable state (1) in row W and generates a PC pulse indicating another increment of forward blade movement. The next input change will be from 00 to 01 causing the circuit to change from the stable state (1) to the unstable state 2 which resolves into the stable state (2) in row X and generates a PC pulse, indicating another increment of forward blade movement. As long as blade 24 moves in a forward direction and the input sequence of signals remains the same, the circuit proceeds through the same state sequence, and each time the input changes a PC or positive count pulse is generated.

The count generator circuit operates in the following manner when the blade 24 moves in reverse, i.e. in the opposite direction. Assuming that the circuit is in the stable state (2) in row X, if the blade reverses the next input will be 00. This causes the circuit condition to move to the first column on the left, but the circuit state will not have changes so we are still in row X and arrive at the stable state (8) and generate a negative count pulse NC. This indicates one increment of reverse blade movement. The next input change will be from 00 to 10 placing the circuit in the unstable state 5 which resolves into the stable state (5) in row W causing generation of another NC pulse, indicating another increment of reverse blade movement. As the blade 24 still continues to travel in a reverse direction, the next input sequence of signals will be 11, and this places the circuit in the unstable state 6 which resolves to the stable state (6) in row Z causing generation of another NC pulse, indicating another increment of reverse blade movement. Further reverse movement of blade 24 causes the inputs to be 01 placing the circuit in the unstable state 7 which resolves to the stable state (7) in row Y generating a pulse NC, indicating another increment of reverse blade movement. Thus, continued movement of the blade 24 in a reverse direction with the foregoing sequence of input signals causes the circuit to generate NC or negative count pulses for each input change, with the circuit going through the sequence of states 8, 5, 6, 7, 8, 5, 6, 7 etc.

By way of further illustration, the table of FIG. 10 can be used to examine the action of the count generator circuit when the tape rule device is first turned on and there is no previous history in terms of direction of movement of blade 24. For example, assume that the input at that particular time coming from the sensors is the steady signal 11. Assume further that the internal state of the count generator circuit starts up at random in any one of the four possible conditions W, X Y or Z. If any of the initial states is unstable it will resolve to its designated stable state so that after a very brief resolution time the circuit will be in either stable state (3) in row Y or stable state (6) in Z. The count pulse generated by this initial transition is blanked and prevented from affecting the counter or error monitor by a system turn-on timer (not shown). Assume, for example, that the circuit ends up in the stable state (6). If the first motion of the blade 24 is in a forward direction, the input signals will change from 11 to 10 and the next stable state will be (4) and a positive count pulse PC will be generated. On the other hand, if the initial motion of the blade is in the reverse direction, the next sequence of inputs will be 01 and the state of the circuit will move to the unstable state 7 and then to the stable state (7) of row Y causing generation of a negative count or pulse NC. Thus, regardless of the initial condition of the circuit, the first input change which occurs will cause the circuit state to align properly with the intended direction.

The operation of the count generator is further illustrated by the following example. Assume that the circuit is in an initial state corresponding to stable state (6) of the preceeding example and assume that the blade 24 merely vibrates over one increment of distance in a reverse direction, with the result that the input sequence of signals is 11, 01, 11, 01, 11 etc. The circuit state sequence would then be from the stable state (6) to the unstable state 7 which would resolve into the stable state (7) of row Y giving a negative count signal NC and then to the positive state (3) giving a positive count signal PC back to the stable state (7) giving a negative count signal NC, and so on. Thus a series of positive counts and negative counts will be generated as expected. While valid input signal sequences for this circuit do not include double changes, the presence of scratches or dirt marks on the blade 24 could create such a possibility. A double change would be an input change from 00 to 11, for example, or from 01 to 10. In such cases the circuit action still would be defined. For example, starting in the stable state (1) and having a double change in inputs from 00 to 11 would place the circuit in the unstable state 6 which would resolve to the stable state (6) giving a negative count NC. Although the circuit action and the outputs are determinant, they would be incorrect in terms of count which would be detected by the error monitor, the operation of which will be described.

In the block diagram of FIG. 9, two count generators 178 and 180 are shown, both of which are constructed and operate in identically the same way with the exception that one of the generators 178 operates in channel M and the other count generator 180 operates in channel N. The outputs of both count generators are connected to the error control or error monitor circuitry. Only one of the count generator outputs is routed to the main system counter which keeps track of the total count for subsequent conversion to the proper measuring units and then display.

FIG. 11 illustrates one form of count generator 178 using AND-OR logic wherein lines 204 and 206 are connected to the true and complement outputs, respectively, of synchronizer 172 and lines 208 and 210 are connected to the true and complement outputs, respectively, of the synchronizer 173. Count generator 180 is of identical construction.

The error monitor circuitry designated 186 in FIG. 9 functions to keep track of the count signals generated by the components of two channels M, N and whenever there is a difference of more than plus or minus one between the counts, the circuitry 186 signals that an error has occurred. This is done by continually subtracting the count signals generated by the count generator 180 from the count signals generated by the count generator 178. The PC1 pulses produce positive counts and the NC1 pulses produce negative counts in the counter 182. In order to subtract the counts produced by count generator 180, the PC2 pulses are considered negative and the NC2 pulses are considered positive. The error monitor circuitry 186 keeps track of the foregoing and the following four states: state one where the count difference is zero, that is both channels have generated the same number of counts considering algebraic signs; state two where the count difference is plus one, that is where channel M has generated one more count than channel N; state three where the count difference is minus one, that is where channel M has generated one less count than channel N; and state four where the count difference is greater than plus or minus one indicating that an error has occurred.

The nature of the count generators 178 and 180 is such that each count generator will generate either a positive count pulse or a negative count pulse whenever an input change occurs, but the count generator cannot generate both a positive and a negative count pulse at the same time. Accordingly, the error monitor circuitry 186 will have as inputs PC1, NC1, PC2 and NC2 as indicated in FIG. 9. However, count generators 178 and 180 can generate PC1 and PC2 pulses at the same time, NC1 and NC2 pulses at the same time, PC1 and NC2 pulses at the same time, and NC1 and PC2 pulses at the same time. The logic state table of FIG. 12 shows only those input combinations which possibly can occur and also illustrates the required circuit action as a result of those inputs. The four left-hand columns in the table of FIG. 12 represent the logic signals on the input pulse lines PC1, NC1, PC2 and NC2. The first eight rows show the allowable input combinations. In particular the first four rows represent a pulse on only one of the four lines, and the second four rows show the possible time coincidences which may occur, namely a pulse on either one of the PC1 or NC1 lines and a pulse on either one of the PC2 and NC2 lines. Combinations which cannot occur by virtue of the design of the count generators are any of those where pulses occur on both PC1 and NC1 input lines, on both PC2 and NC2, or on all four lines. The final input combination of all zeros, i.e. no pulse occurring on any input, is a null input which will cause no circuit change.

The right-hand portion of the table of FIG. 12 shows the desired circuit action in response to each one of the input combinations and in conjunction with the previous state of the circuit. In particular, the circuit state represents the previous balance or difference between the counts from count generators 178 and 180. The circuit will account for previous balances of minus 1, 0 and plus 1 as shown on the headings of the columns. The entries in the columns show the next balance or state that will occur as a result of the particular input combination. Referring to row 1 in the table, a PC1 pulse arriving alone will add one to the previous balance so that the next balance under the minus 1 previous state becomes zero, under the zero previous state, plus 1, and under the plus 1 previous state, an error indication E, signaling that two count signals have been received from channel M and no intervening count signals have been received from channel N thereby indicating an error. In row 2 of the table there is shown an NC1 pulse arriving which subtracts 1 from the previous balance causing the minus 1 previous state to go to an error indication E, the zero previous state to go to a minus 1 state, and the plus 1 previous state to go to zero. Turning to the cases of allowable double pulse inputs, row 5 of the table shows a PC1 and PC2 pulse arriving at the same time, one of which adds to the count and the other of which subtracts from the count so that the net result is no change. In other words, the previous states stay the same as indicated in the table. The same situation is shown in row 8 of the table where NC1 and NC2 pulses occur at the same time. When a PC1 and an NC2 pulse occur at the same time, the PC1 adds a count and the NC2 also adds a count with the net result being an addition of two to the previous state. As shown in the table, the minus 1 previous state goes to plus 1, the zero previous state and the plus one previous state both go to the state where an error E is indicated. The foregoing illustrates the input combinations which must be accounted for in the circuit and the foregoing table completely defines the action of the error monitor circuitry 186. The allowable input combinations are identified with letters Q–Y in the final column in the table of FIG. 12.

FIG. 13 shows essentially the same information as that of FIG. 12 but in the more graphic format of a state diagram. The four stable states are shown as circles. State 1 represents a balance of zero, in other words the total counts from count generators 178 and 180 equals a balance of zero. State 2 represents a balance of plus 1, state 3 represents a balance of minus 1, and state 4 represents a balance of greater than plus or minus 1 which is the error state. The arrows indicate the possible transitions from one state to another and the labels on the arrows indicate which input combinations, labelled by the letters Q through Y, will cause the transition. Following the slash line, the output will be generated on the error signal output line. Thus, considering state 1, the arrow leaves state 1 and returns to state 1, i.e. a self-loop arrow, and is labelled UXY/0 which means that when any of the input combinations U, X, Y occurs the state does not change and no output is generated on the error signal line. On the other hand, the arrow leading from state 1 to state 2 is labelled Q,T/0 and indicates that if a Q input occurs, i.e. a PC1 pulse, or a T input occurs, i.e. an NC2 pulse, then a transition is made from state 1, having a balance of zero, to state 2, having a balance of plus 1, but no output is generated on the error signal line. All possible transitions between states arising from the possible input combinations are illustrated. The error alarm can be implemented by generating a pulse whenever the circuit enters state 4 as indicated on the state diagram, or a steady state indication of the error condition can be obtained from the state 4 condition in the circuit. The circuit can be built using two internal state flip-flops and appropriate input gating which will give the four state conditions required.

Once the system reaches state 4 and an error is indicated, none of the allowable inputs Q through Y can cause the system to return to state 1 enabling it to begin again. This is performed by the reset function indicated in broken lines in FIG. 13 which basically is an over-riding function performed externally to the particular circuit by applying a reset pulse to the circuit flip-flop to set them back to state 1. One consideration in the design of the reset circuit relates to mechanical tolerances which would make possible the blade 24 of the tape rule device stopping in such a position that the sensors of channel M do not agree in terms of signal with the sensors of channel N. For example, the ab signals derived from the sensors of channel M might be 01 while the ab signals derived from the sensors of channel N are 00. The b sensor of channel N could be misaligned enough such that it still reads zero while the b sensor of channel M reads one. If at such a time the error monitor circuitry 186 had been functioning properly and no error had been detected, then the error monitor would be in state 2, having read a pulse from channel M but not yet having had a pulse from channel N. It is to be noted that such a disparity might appear at the outputs of the synchronizers and therefore at the inputs of the count generator circuit illustrated in FIG. 11 via leads 204, 206, 208 and 210 and yet might not have appeared on the outputs of the M flipflops of the count generators because one clock period is required for this information to propagate through the M and N flipflops of the count generator. Likewise, such a disparity might be transient only and could appear at the outputs of the M and N flipflops of the count generator at the same time that a reset pulse wall called for and yet not appear at the inputs 204, 206, 208 and 210. In such a condition if the error monitor circuit 186 were to be reset, it should not be reset to state 1 but rather to state 2. If the error monitor is reset to state 1 under such a rare but possible circumstance it would be reset with an undesirable bias. The foregoing can be avoided by designing error reset circuitry in such a way that it does not apply a reset pulse to the error monitor circuit 186 unless the a and b signals from the sensors of two channels are in proper agreement. Thus if an attempt is made to perform the reset at any other time, the reset circuitry will store the information and perform the reset at the first interval when proper agreement between the channels is noted.

A type of circuit which can be employed to implement such a controlled reset function is illustrated in FIG. 14. It includes a comparison circuit 220 having inputs coupled to the signals derived from the sensors in the two channels. In particular, lines 221 and 222 connect corresponding inputs of comparison circuit 220 to the outputs of the synchronizing circuits 172 and 173, respectively, in the system of FIG. 9. Lines 223 and 224 connect corresponding inputs of comparison circuit 220 to the outputs of the synchronizing circuits 174 and 175, respectively, in the system of FIG. 9. In addition, lines 225 and 226 connect corresponding inputs of comparison circuit 220 to the M flipflops of the count generators and lines 227 and 228 connect corresponding inputs of comparison circuit 220 to the N flipflops of the count generators. Comparison circuit 220 functions to provide a logical one output signal on line 230 only when proper agreement between the input channels is detected, for example only when the outputs of synchronizing circuits 172 and 173 are equal and only when the outputs of synchronizing circuits 174 and 175 are equal, and in addition when the outputs of the M flipflops of the count generators are equal and when the outputs of the N flipflops are equal. Thus, a logical one output signal on line 230 occurs only when the inputs from the photosensors are such as to allow a reset function to take place. Line 230 is connected to one input of an AND gate 232. The reset level, a constant logic one level provided by source 192, is connected through the manually-operated switch 194 to a flip-flop 238 which merely functions to synchronize the request for a reset with the system clock pulse. The output of the synchronizing flip-flop 238 is connected to a flip-flop 240 which in combination with an AND gate 242 generates a single pulse which is applied to the input of flip-flop 244 each time the reset control switch 194 is depressed. The flip-flop 244 functions as a memory and escapement and stores a logical one as a result of a pulse input from the gate 242 thereby enabling the gate 232. When the comparison circuit 220 detects the proper conditions for a reset pulse, then, and only then, will a single reset pulse be admitted on the reset pulse line 248 which is connected to the flip-flops of error monitor 186. This pulse at the same time resets the flip-flop 244 thereby allowing no further action until the reset switch 194 is opened and reclosed. If the comparison circuit 220 has already enabled the gate 232 then as soon as the flip-flop 244 is set the reset pulse will be generated. On the other hand, if operation of switch 194 sets the flip-flop 244 before the comparison circuit 220 detects the proper conditions for a reset, then the flip-flop 244 and the gate 232 will wait until the proper conditions are attained.

The foregoing control is provided for both the manually-operated reset initiated by manual operation of switch 194 and the automatic reset initiated component 198 shown in FIG. 9. In this connection, comparison circuit 220, flip-flops 238, 240 and 244 and gates 232 and 242 comprise the reset generator designated 196 in FIG. 9. Manual reset may be effected any time by the user, for example after an error is signaled. Automatic reset can be effected by component 198 each time blade 24 is retracted, component 198 being a limit switch or other sensor which is enabled by the blade 24 when it is fully retracted to the zero position. In both instances, a reset is completed only when the signals derived from the photosensors in each channel are in a predetermined condition, i.e. are equal.

An illustrative form of conversion means which can be employed in arithmetic unit 184 is a commercially available microprocessor, for example a Motorola M6800, connected to the output of counter 182 and programmed to multiply the input quantity by a factor of 0.020 or 0.508 as determined by the position of a manually-operated English-Metric selector switch. Each time the quantity in counter 182 changes a request is made for a multiplication cycle and when the microprocessor is not busy, it completes the multiplication cycle and places the result in a result register operatively connected to display 54. Commercially available microprocessor such as the afore-mentioned Motorola M6800 can perform the multiplications at speeds compatible with operation of the tape rule measuring device. As an alternative, the combination of counter 182 and conversion means of unit 184 would be an adder which receives as inputs the PC1 and NC1 signals. For each PC1 or NC1 input signal, the adder adds or subtracts the quantity 0.508 and places the result in a Metric units register and simultaneously adds or subtracts the quantity 0.020 and places the result in an English units register. Either register is connected to display 54 under control of an English-Metric selection switch.

In use, the tape rule measuring device is manipulated by hand in a known manner to measure distances with blade 24. As the blade is drawn or extended out from housing 10 in a forward direction the optical markings detected by the photoelectric sensors cause the generation of PC1 pulses, one pulse for each detected increment of forward blade movement, which are converted by the combination of counter 182, unit converter 184 and display 54 into a visual readout of forward distance traversed by blade 24. Any return movement of blade 24 results in the generation of NC1 pulses, one pulse for each detected increment of rearward blade movement, which pulses subtract from the result provided by the PC1 pulses so that the combination of counter 182, arithmetic unit 184 and display 54 provides a readout of the net distance traversed by blade 24 regardless of the number of extensions or retractions of the blade. Display of the measured distance in English or Metric units is selected by the user by means of a switch on the housing 10. The arrangement of the optical markings on the blade is compatible with conventional graduations and related indicia on the blade which also are visible to the user so that the tape rule measuring device is both human readable and machine readable during use. If any scratches, marks or other defects develop on blade 24 or the optical markings which would cause an incorrect readout of distance traversed by the blade, the two channel arrangement of photoelectric sensors and related circuits together with the error detection circuitry 186 detects such an error condition and signals the same to the user such as by energizing an appropriate error warning light on the casing 10 or by flashing the display, the latter approach allowing the measurement to be completed and read at the user's discretion. Both after an error is signaled and after the blade 24 is retracted into casing 10, the error monitoring circuitry is reset in a manner controlled according to signal conditions of the photoelectric sensors in order to insure that the error monitor is returned to the proper initial conditions. The combination of optical markings on blade 24 and photoelectric sensors carried by housing 10 is compatible with the wide range of blade retraction speeds in tape rules. The foregoing is provided in a manner keeping the tape rule device small in size and light in weight so as to be handheld and portable.

The storage or memory provided by the arrangement of registers 200 serves to store the present reading or indication in the memory upon command by the user. This is done by manual operation of a push button switch designated store (not shown) on the housing 10 which effects appropriate control of the memory 200 through control circuits designated 260 in FIG. 9. In the device shown up to six readings may be stored in sequence in resonse to sequential operation of the store push button. Manual operation of a push button switch designated recall (not shown) on the housing 10 recalls the readings stored in the memory 200 in the sequence in which the readings were stored. The recalled readings are transferred to display 54. The recall push button effects appropriate control of the memory 200 through the control circuits 260. The first depression of the recall button recalls the earliest reading stored, the next depression recalls the next reading that was stored and so on. Manual operation of a push button switch designated accumulate (not shown) on the housing 10 adds the number displayed into the memory 200. The accumulate push button effects appropriate control of the memory 200 through the control circuits 260. Operation of the accumulate push button adds the displayed number to the last number stored. In order to clear the memory and begin the accumulation of a set of readings, the first one is entered by pushing the store button, and subsequent entries are added to that one by pushing the accumulate button. In this manner, up to six separate sums may be accumulated in the device shown, and these sums can be recalled for display by operation of the recall button as described above.

A reverse push button (not shown) on housing 10 is operatively connected through control circuits designated 262 connected to counter 182 in the circuit of FIG. 9. Manual operation of this button serves to reverse the sense of counter 182 so that the displayed measurement decreases as blade 24 is extended. As a result, after the user presses the recall button to recall a reading or measurement from storage 200, the blade 24 can be extended until display 54 shows zero at which time the recalled measurement is represented by the length extension of blade 24. This can be repeated for the number of readings stored in memory 200. This is particularly advantageous for the user who makes several measurements on a job site and then returns to a work area and must recall these measurements for use. Using the recall and reverse operations, the user avoids having to write down the several measurements and then measure out each length. In addition, the reverse button allows the user to lay out his measurement to whatever tolerance he wishes. This is because when blade 24 has been extended so display 54 reads near zero, the actual reading in display 54 will indicate the deviation from the exact measurement recalled.

It is therefore apparent that the present invention accomplishes its intended objects. While several embodiments of the present invention have been described in detail, this is for the purpose of illustration, not limitation.

We claim:

1. In a measuring device comprising a housing and an elongated coilable tape blade measuring element biased in a coiled condition in said housing with one end fixed to said housing and a free end adapted to be moved toward and away from said housing to traverse a distance to be measured:
    (a) a series of optical markings at constant intervals along said blade for indicating the passage of distance when said markings are irradiated and said blade is moved relative to said housing;
    (b) photoelectric sensing means carried by said housing and operatively associated with said markings on said blade for providing output signals at constant increments of distance during movement of said blade; and
    (c) readout means operatively connected to said sensing means for converting said signals to an indication of the distance traversed by said blade.

2. A measuring device according to claim 1, wherein said optical markings comprise adjacent areas of first and second optical characteristics in cyclic relation along said blade, there being transitions between said areas at constant intervals along said blade.

3. A measuring device according to claim 2, wherein said optical markings comprise adjacent light absorbing and light reflecting areas.

4. A measuring device according to claim 2, wherein said photoelectric sensing means comprises a pair of photoelectric sensors optically coupled to said markings and each providing output electrical signals indicating said transitions during movement of said blade, said sensors being optically coupled to said markings in a manner such that only one of said transitions is sensed by either of said sensors at a given time.

5. A measuring device according to claim 4 wherein said markings comprise a pair of side-by-side tracks of said adjacent areas, the transitions along said tracks being in staggered relation.

6. A measuring device according to claim 1, wherein said housing is sufficiently small in size and light in weight to be handheld and portable.

7. A measuring device according to claim 1, wherein said blade has a width defined between two substantially parallel edges and wherein said optical markings are provided along said blade generally centrally of said edges.

8. A measuring device according to claim 1 further including visible graduations and related indicia along said blade so that a measurement may be directly read from said blade.

9. A measuring device according to claim 1 further including means carried by said housing for illuminating said optical markings.

10. A measuring device according to claim 9, wherein said means for illuminating said markings comprises a light source and a fiber optic bundle having one end located to receive light from said source and the other end positioned closely adjacent said blade in the region of said optical markings.

11. Apparatus according to claim 1, wherein said photoelectric sensing means comprises at least one photoelectric sensor carried by said housing and a fiber optic bundle having one end operatively coupled to said sensor and the other end positioned closely adjacent said blade in the region of said optical markings.

12. A measuring device according to claim 1, wherein said readout means includes digital display means for providing a visual indication of said distance.

13. A measuring device according to claim 1, wherein said readout means includes digital display means and conversion means connected to actuate said display means whereby a visual indication of said distance is provided in units of measure.

14. A measuring device according to claim 13, wherein said conversion means includes manually selectable means for providing said units of measure in English or Metric units.

15. A measuring device according to claim 1, wherein said readout means includes storage means for holding said indication until another measured distance is to be indicated.

16. A measuring device according to claim 1, wherein said readout means comprises:
(a) logic circuit means connected to said photoelectric sensing means for converting said signals into digital pulses of first and second types depending upon the direction of movement of said blade relative to said housing; and
(b) counting means operatively connected to said logic circuit means for counting said pulses to indicate the net distance traversed by said blade.

17. A measuring device according to claim 16 further including digital display means coupled to the output of said counter for providing a visual display of said net distance.

18. A measuring device according to claim 17 further including control means operatively connected to said counting means for controlling the sense of said counting means whereby increase or decrease of said distance displayed can be selected for movement of said blade in one direction.

19. A measuring device according to claim 18, wherein said readout means further includes storage means for storing a plurality of indications, first control means for controlling operation of said storage means to store said indications in a sequential manner and additional control means for recalling sequentially indications stored in said storage means for display by said display means.

20. A measuring device according to claim 1, wherein said photoelectric sensing means comprises a pair of photoelectric sensors optically coupled to said markings, said sensors and said markings being in a phase relation whereby output signals derived from said pair of sensors comprise a two bit cycle code containing information of direction of movement of said blade.

21. A measuring device according to claim 20, wherein each of said sensors is optically coupled to said markings by fiber optic means.

22. A measuring device according to claim 20 further including logic circuit means coupled to said sensors for providing logical output signals of a first type indicating increments of blade movement in one direction and of a second type indicating increments of blade movement in the opposite direction.

23. A measuring device according to claim 22 further including counting means connected to said logic circuit means for providing a result indicative of the net distance traversed by said blade.

24. A measuring device according to claim 23 further including:
(a) conversion means connected to said counting means for converting said distance indication to units of measure; and
(b) display means connected to said conversion means for providing a visual display of the net distance traversed by said blade.

25. A measuring device according to claim 22 further including:
(a) another pair of photoelectric sensors optically coupled to said markings;
(b) another logic circuit means coupled to said other pair of sensors for providing logical output signals of a first type indicating increments of blade movement in one direction and of a second type indicating increments of blade movement in the opposite direction; and
(c) error detecting means connected to both of said logic circuit means for comparing the output signals of said logic circuit means and for generating a signal indicative of an error where the logical output signals of said logic circuit means vary from one another by more than a predetermined amount.

26. A measuring device according to claim 25 further including controlled reset means operatively connected to said error detecting means and operatively coupled to both of said pairs of photoelectric sensors for resetting said error detecting means from an error indicating condition only when a predetermined relationship exists between signals derived from said photoelectric sensors.

27. A measuring device according to claim 26, wherein said reset means comprises:
(a) means for generating a reset pulse;
(b) comparison means operatively coupled to said pairs of sensors for generating a logical output signal indicative of a predetermined condition of signals derived from said sensors; and
(c) gating means having inputs connected to said reset pulse generating means and to the output of said comparison means and having an output connected to said error detecting means for gating a reset pulse to said error detecting means only in response to said logical output signal from said comparison means.

28. A measuring device according to claim 1 further including:
(a) another photoelectric sensing means carried by said housing and operatively associated with said markings on said blade for providing output signals at constant increments of distance during movement of said blade; and
(b) error detecting means operatively coupled to both of said photoelectric sensing means for signaling an error when the difference between the number of output signals of said photoelectric sensing means exceeds a predetermined amount.

29. A measuring device according to claim 28 wherein said error detecting means is a sequential circuit having an error indicating state and at least one additional state.

30. A measuring device according to claim 29 further including reset means connected to said error detecting means and operatively coupled to each of said photoelectric sensing means for resetting said error detecting means to said additional state only when said output signals from said photoelectric means are of a predetermined nature.

31. A measuring device according to claim 30 wherein said reset means comprises;
(a) AND gate means having an output connected to said error detecting means and a pair of inputs;
(b) reset pulse generating means connected to one input of said AND gate means; and
(c) means connected to the other input of said AND gate means and operatively coupled to each of said photoelectric sensing means for providing a logical one signal on said AND gate input only in response to a predetermined condition of the output signals of said photoelectic sensing means.

32. A measuring device according to claim 1, wherein said photoelectric sensing means comprises a plurality of photoelectric sensors operatively associated with said markings in a vernier arrangement.

33. A measuring device according to claim 1, wherein said readout means includes storage means for storing a plurality of indications and selective switching means for controlling operation of said storage means to store said indications.

34. A measuring device according to claim 33, further including additional control switching means for recalling indications stored in said storage means.

35. A measuring device according to claim 34, wherein said readout means further includes display means for providing a visual indication of said distance, said additional control means causing said indications recalled from said storage means to be displayed by said display means.

36. A measuring device according to claim 33, wherein said readout means further includes display means for providing a visual indication of said distance and means for controlling operation of said display means and said storage means for adding a displayed indication to the last indication stored in said storage means.

37. Measuring apparatus comprising:
(a) a body member;
(b) an elongated member adapted to be extended and retracted relative to said body member;
(c) a series of markings along said elongated member comprising a plurality of areas of first and second characteristics in cyclic relations, there being transitions between said areas at constant intervals along said elongated member;
(d) a pair of sensing means carried by said body member for sensing the movement of said elongated element in response to the movement of said markings thereby, each of said sensing means providing a signal of a first type in response to said marking areas of said first characteristic and a signal of a second type in response to said marking areas of said second type during relative movement between said elongated member and said body member, said sensing means and said markings being phase related to provide said signals in a two bit cyclic code indicative of the direction of movement of said elongated member;
(e) logic circuit means connected to said sensing means for converting said signals in said two bit cyclic code to logic signals of first and second types representing increments of distance travelled by said elongated member in opposite directions; and
(f) means operatively connected to said logic circuit means for converting said logic signals to an indication of the net distance said elongated member is extended from said body member.

38. Measuring apparatus according to claim 37, wherein said markings comprise optical markings and each of said sensing means comprises a photoelectric sensor spaced from said elongated member and a fiber optic bundle, one end of which is operatively associated with said sensor and the opposite end of which is closely adjacent said optical markings.

39. Measuring apparatus comprising:
(a) a body member;
(b) an elongated member adapted to be extended and retracted relative to said body member, the relative movement between said members being at a speed over a relatively wide range;
(c) a series of markings along said elongated member at constant intervals;
(d) first and second sensing means carried by said body member for sensing the movement of said elongated member in response to the movement of said markings thereby, each of said sensing means providing output signals corresponding to increments of distance during relative movement between said body member and said elongated member, said output signals containing information as to the direction of movement of said elongated member relative to said body member;
(e) converting means connected to one of said sensing means for converting said output signals to an indication of the net distance travelled by said elongated member relative to said body member; and
(f) monitoring means operatively connected to said first and second sensing means for comparing said output signals to indicate when the difference between the number of output signals provided by said first and second sensing means exceeds a predetermined amount.

40. Measuring apparatus according to claim 39, wherein said monitoring means comprises a sequential circuit having a stable error indicating state and at least one additional stable state and wherein said apparatus further includes reset means operatively connected to said monitoring means for placing said sequential circuit in said other state.

41. Measuring apparatus according to claim 40, further including control means connected to said reset means and operatively connected to said sensing means for allowing operation of said reset means only in response to a predetermined condition of the output signals from said sensing means.

42. In measuring apparatus comprising a body member, an elongated element adapted to be extended and retracted relative to said body member, a series of markings at fixed intervals along said elongated element and at least two sensing means carried by said body member to sense said markings for providing output signals indicative of the extent of travel of said elongated element relative to said body:
(a) error detecting means operatively connected to said sensing means and having at least two stable states, one of said states being an alarm indicating a predetermined relation between the signals from said sensing means; and
(b) reset means connected to said error detecting means and to said sensing means for returning said error detecting means to the other of said stable states only when the signals from said sensing means are of a predetermined nature.

43. Apparatus according to claim 42, wherein each of said sensing means comprises a pair of sensor elements and wherein said reset means comprises:
(a) means for generating a reset signal;
(b) comparison means operatively connected to each of said pairs of sensors for generating an output signal indicative of identity between signals derived from each of said pairs of sensors; and
(c) gating means connected to said reset signal generating means and said comparison means and to said error detecting means for allowing transmission of a reset signal to said error detecting means only in response to the presence of said output signal from said comparison means.

* * * * *

UNITED STATES PATENT AND TRADEMARK OFFICE
CERTIFICATE OF CORRECTION

PATENT NO. : 4,161,781
DATED : July 17, 1979
INVENTOR(S) : William J. Hildebrandt & Robert F. West It is certified that error appears in the above-identified patent and that said Letters Patent are hereby corrected as shown below:

Column 4, line 44, "marking" should be --making--.

Column 7, line 48, after "72a", insert --,--.

Column 8, line 7, "firt" should be --first--.

Column 8, line 55, "logic" should be --logical--.

Column 9, line 66, after "can", insert --be--.

Column 12, line 44, after "photoelectric", insert --sensors--.

Column 15, line 33, "on" should be --to--.

Column 17, line 27, "changes" should be --changed--.

Column 20, line 56, "flip-flop" should be --flip-flops--.

Column 21, line 14, "wall" should be --was--.

Signed and Sealed this

Twenty-fifth Day of December 1979

[SEAL]

Attest:

Attesting Officer

SIDNEY A. DIAMOND

Commissioner of Patents and Trademarks